US009941196B2

United States Patent
Lee et al.

(10) Patent No.: US 9,941,196 B2
(45) Date of Patent: Apr. 10, 2018

(54) SEMICONDUCTOR DEVICE, FABRICATING METHOD THEREOF AND SEMICONDUCTOR PACKAGE INCLUDING THE SEMICONDUCTOR DEVICE

(71) Applicants: Ho-Jin Lee, Seoul (KR); Tae-Je Cho, Hwaseong-si (KR); Dong-Hyeon Jang, Yongin-si (KR); Ho-Geon Song, Suwon-si (KR); Se-Young Jeong, Suwon-si (KR); Un-Byoung Kang, Hwaseong-si (KR); Min-Seung Yoon, Seoul (KR)

(72) Inventors: Ho-Jin Lee, Seoul (KR); Tae-Je Cho, Hwaseong-si (KR); Dong-Hyeon Jang, Yongin-si (KR); Ho-Geon Song, Suwon-si (KR); Se-Young Jeong, Suwon-si (KR); Un-Byoung Kang, Hwaseong-si (KR); Min-Seung Yoon, Seoul (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 15/130,904

(22) Filed: Apr. 15, 2016

(65) Prior Publication Data
US 2016/0233155 A1    Aug. 11, 2016

Related U.S. Application Data

(62) Division of application No. 14/072,777, filed on Nov. 5, 2013, now Pat. No. 9,343,361, which is a division (Continued)

(30) Foreign Application Priority Data

Nov. 29, 2010  (KR) .................. 10-2010-0119757

(51) Int. Cl.
H01L 21/768     (2006.01)
H01L 23/498     (2006.01)
(Continued)

(52) U.S. Cl.
CPC .. *H01L 23/49844* (2013.01); *H01L 21/76831* (2013.01); *H01L 21/76844* (2013.01);
(Continued)

(58) Field of Classification Search
None
See application file for complete search history.

(56) References Cited

U.S. PATENT DOCUMENTS 6,404,055 B1   6/2002  Jeon et al.
6,624,514 B2   9/2003  Kasai
(Continued)

FOREIGN PATENT DOCUMENTS

JP    2005260079 A    9/2005
JP    2006165112 A    6/2006
(Continued)

*Primary Examiner* — Zandra Smith
*Assistant Examiner* — Abbigale Boyle
(74) *Attorney, Agent, or Firm* — Renaissance IP Law Group LLP

(57) ABSTRACT

In one embodiment, a semiconductor device includes a semiconductor substrate having a first surface, and a second surface opposite to the first surface. The second surface defines a redistribution trench. The substrate has a via hole extending therethrough. The semiconductor device also includes a through via disposed in the via hole. The through via may include a via hole insulating layer, a barrier layer, sequentially formed on an inner wall of the via hole. The through via may further include a conductive connector adjacent the barrier layer. The semiconductor device additionally includes an insulation layer pattern formed on the second surface of the substrate. The insulation layer pattern (Continued)

defines an opening that exposes a region of a top surface of the through via. The semiconductor devices includes a redistribution layer disposed in the trench and electrically connected to the through via. The insulation layer pattern overlaps a region of the conductive connector.

16 Claims, 31 Drawing Sheets

Related U.S. Application Data of application No. 13/235,369, filed on Sep. 17, 2011, now Pat. No. 8,592,991.

(51) Int. Cl.
*H01L 23/48* (2006.01)
*H01L 25/065* (2006.01)
*H01L 23/525* (2006.01)

(52) U.S. Cl.
CPC ...... *H01L 21/76898* (2013.01); *H01L 23/481* (2013.01); *H01L 23/49816* (2013.01); *H01L 23/49822* (2013.01); *H01L 23/49827* (2013.01); *H01L 23/49838* (2013.01); *H01L 25/0657* (2013.01); *H01L 23/525* (2013.01); *H01L 2224/02372* (2013.01); *H01L 2224/16* (2013.01); *H01L 2225/06513* (2013.01); *H01L 2225/06544* (2013.01)

(56) References Cited

U.S. PATENT DOCUMENTS

| | | | |
|---|---|---|---|
| 6,953,745 B2 | 10/2005 | Ahn et al. | |
| 7,419,906 B2 | 9/2008 | Kato | |
| 7,432,196 B2 * | 10/2008 | Tanida | H01L 21/76898 257/E21.585 |
| 8,034,704 B2 | 10/2011 | Komai et al. | |
| 8,076,238 B2 | 12/2011 | Hosseini et al. | |
| 8,791,549 B2 | 7/2014 | Chen et al. | |
| 9,041,218 B2 | 5/2015 | Park et al. | |
| 2005/0221601 A1 | 10/2005 | Kawano | |
| 2007/0080457 A1 * | 4/2007 | Tanida | H01L 23/481 257/739 |
| 2008/0136023 A1 | 6/2008 | Komai et al. | |
| 2008/0237849 A1 | 10/2008 | Pratt | |
| 2008/0284041 A1 * | 11/2008 | Jang | H01L 21/76898 257/774 |
| 2008/0303170 A1 | 12/2008 | Tanida et al. | |
| 2010/0038778 A1 | 2/2010 | Lee et al. | |
| 2010/0171226 A1 * | 7/2010 | West | H01L 23/481 257/774 |
| 2011/0068466 A1 * | 3/2011 | Chen | H01L 21/76898 257/737 |
| 2014/0312494 A1 | 10/2014 | Chen et al. | |
| 2014/0322909 A1 | 10/2014 | Chen et al. | |

FOREIGN PATENT DOCUMENTS

| | | |
|---|---|---|
| JP | 2006269860 A | 10/2006 |
| JP | 2007180303 A | 7/2007 |
| JP | 2008147224 A | 6/2008 |
| JP | 2010045370 A | 2/2010 |
| JP | 2011071516 A | 4/2011 |
| KR | 20050015190 B1 | 2/2005 |
| KR | 20080046915 A | 5/2008 |
| KR | 100871388 B1 | 12/2008 |
| KR | 20090049780 B1 | 5/2009 |
| TW | 201112371 A | 4/2011 |

* cited by examiner

SEMICONDUCTOR DEVICE, FABRICATING METHOD THEREOF AND SEMICONDUCTOR PACKAGE INCLUDING THE SEMICONDUCTOR DEVICE

CROSS-REFERENCE TO RELATED APPLICATIONS

This application is a divisional of U.S. patent application Ser. No. 14/072,777, filed Nov. 5, 2013, which is a divisional of U.S. patent application Ser. No. 13/235,369, filed Sep. 17, 2011 which claims the benefit of Korean Patent Application No. 10-2010-0119757 filed on Nov. 29, 2010 in the Korean Intellectual Property Office, and all the benefits accruing therefrom under 35 U.S.C. 119, the contents of which in their entirety are herein incorporated by reference.

BACKGROUND

1. Technical Field

The present disclosure relates to a semiconductor device, a fabricating method thereof, and a semiconductor package including the semiconductor device.

2. Description of the Related Art

The manufacture of low-cost semiconductor products that are more reliable, light, compact, fast, multi-functional, and highly efficient has long been an important goal for the electronic industry. One of the technologies that promises to achieve such a goal is a multi-chip stack package technology or system-in-package (SIP) technology employing a through-silicon via (TSV).

The multi-chip stack package or SIP, multiple semiconductor devices performing different functions are assembled in a single semiconductor package body to save space for the electronic components. Although the thickness of the multi-chip stack package or SIP is greater than a conventional single chip package, its two-dimensional area can be about the same as that of the conventional single chip package. Accordingly, the multi-chip stack package or SIP is mainly used for products requiring a high efficiency, a small size and portability, such as mobile phones, notebook computers, memory cards, or portable camcorders.

SUMMARY

In one embodiment, a semiconductor device comprises a semiconductor substrate having a first surface, and a second surface opposite to the first surface. The second surface defines a redistribution trench. The substrate has a via hole extending therethrough. The semiconductor device also includes a through via disposed in the via hole. The through via may include a via hole insulating layer, a barrier layer, sequentially formed on an inner wall of the via hole. The through via may further include a conductive connector adjacent the barrier layer. The semiconductor device additionally includes an insulation layer pattern formed on the second surface of the substrate. The insulation layer pattern defines an opening that exposes a region of a top surface of the through via. The semiconductor devices includes a redistribution layer disposed in the trench and electrically connected to the through via. The insulation layer pattern overlaps a region of the conductive connector.

In another embodiment, a semiconductor device comprises a semiconductor substrate having a first surface and a second surface opposite to the first surface. The second surface defines a redistribution trench. The substrate has a via hole extending therethrough. A through via is disposed in the via hole and includes a via hole insulating layer and a conductive connector sequentially formed in the via hole. The semiconductor device further includes an insulation layer pattern formed on the second surface of the substrate. The insulation layer pattern defines an opening that exposes a region of a top surface of the through via. The semiconductor device additionally includes a redistribution layer disposed in the redistribution trench and electrically connected to the through via. The insulation layer pattern covers an interface region between the second surface of the substrate and a top surface of the via hole insulating layer.

In still another embodiment, a method of fabricating a semiconductor device includes forming a via hole in a semiconductor substrate; forming a via hole insulating layer within the via hole; forming a conductive conductor layer within the via hole to form a through via extending from a first surface of the semiconductor substrate; thereafter, forming a redistribution trench in a substrate surface of the substrate opposite to the first surface to define a second surface of the substrate, the redistribution trench connected with the via hole; forming an insulation layer on the second surface including the trench; and removing a region of the insulation layer to form an insulation layer pattern that defines an opening that exposes a region of the conductive conductor layer.

BRIEF DESCRIPTION OF THE DRAWINGS

The above and other features and advantages of the inventive concept will become more apparent by describing in detail preferred embodiments thereof with reference to the attached drawings in which.

DETAILED DESCRIPTION OF THE EMBODIMENTS

Figure 1:
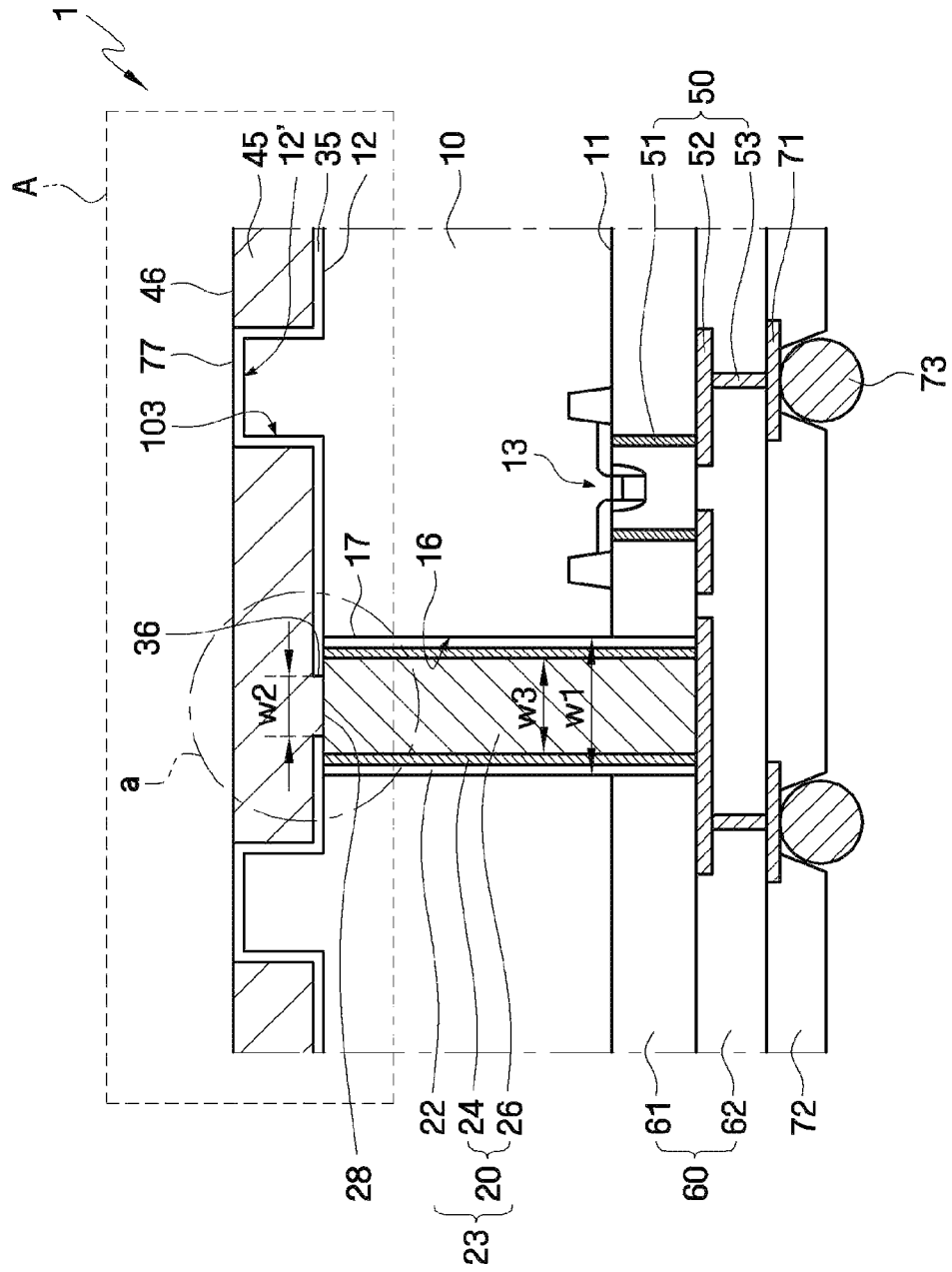
FIG. 1 is a cross-sectional view illustrating a semiconductor device according to an embodiment of the inventive concept.

Advantages and features of the present disclosure and methods of accomplishing the same may be understood more readily by reference to the following detailed description of preferred embodiments and the accompanying drawings. The present disclosure may, however, be embodied in many different forms and should not be construed as being limited to the embodiments set forth herein. Rather, these embodiments are provided so that this disclosure will be thorough and complete and will fully convey the concept of the invention to those skilled in the art, and the present disclosure will only be defined by the appended claims. In the drawings, the thickness of layers and regions are exaggerated for clarity.

Like numbers refer to like elements throughout. As used herein, the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "made of," when used in this specification, specify the presence of stated features, integers, steps, operations, elements, and/or components, but do not preclude the presence or addition of one or more other features, integers, steps, operations, elements, components, and/or groups thereof.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present disclosure.

Embodiments described herein will be described referring to plan views and/or cross-sectional views by way of ideal schematic views of the invention. Accordingly, the exemplary views may be modified depending on manufacturing technologies and/or tolerances. Therefore, the embodiments of the invention are not limited to those shown in the views, but include modifications in configuration formed on the basis of manufacturing processes. Therefore, regions exemplified in figures have schematic properties and shapes of regions shown in figures exemplify specific shapes of regions of elements and not limit aspects of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Figure 2:
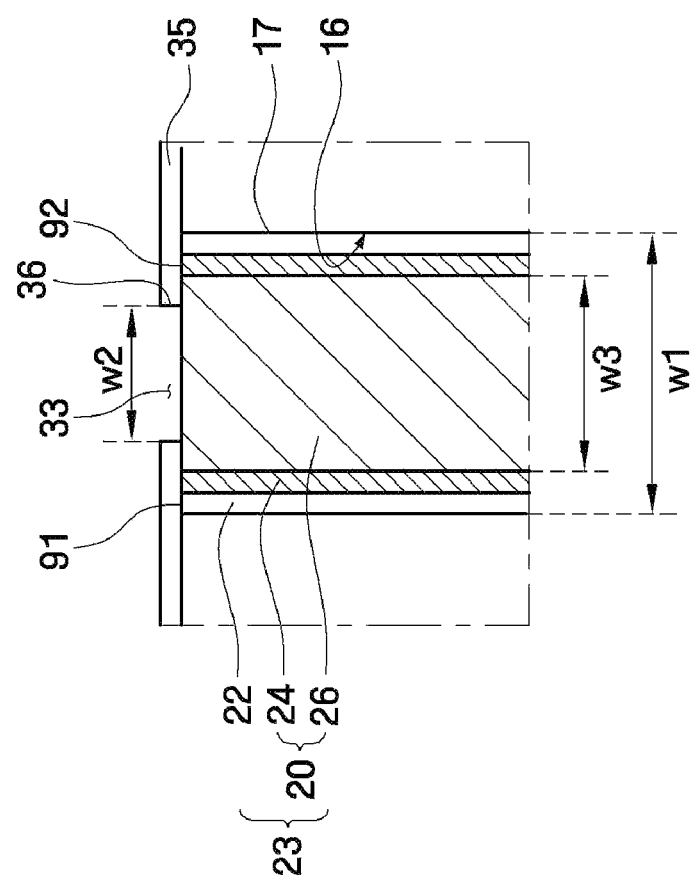
FIG. 2 is an enlarged view of a portion 'a' shown in FIG. 1.
Figure 3:
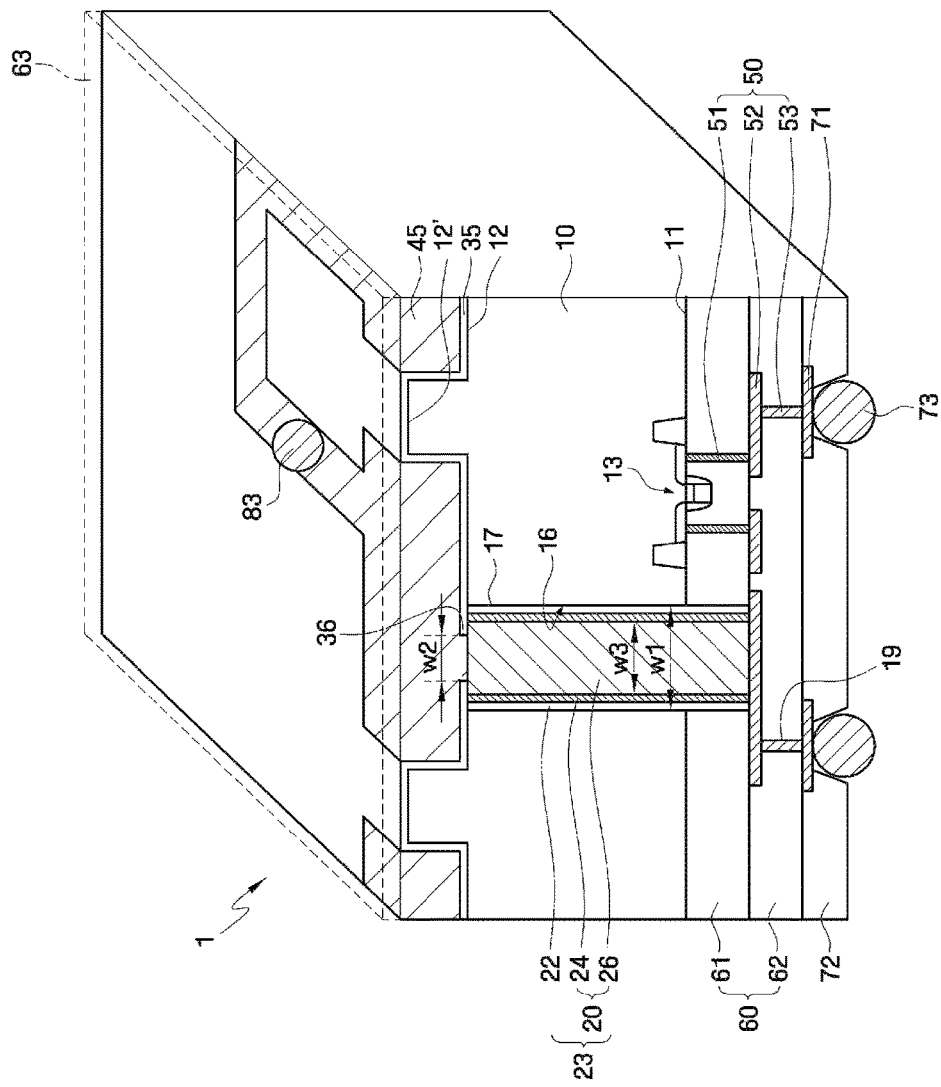
FIG. 3 is a cross-sectional perspective view showing a through silicon via (TSV) formed in the semiconductor device shown in FIG. 1.

A semiconductor device according to an embodiment of the inventive concept will be described with reference to FIGS. 1 to 3. FIG. 1 is a cross-sectional view illustrating a semiconductor device according to an embodiment of the inventive concept, FIG. 2 is an enlarged view of a portion 'a' shown in FIG. 1, and FIG. 3 is a cross-sectional perspective view taken along a region where a through silicon via is formed in the semiconductor device shown in FIG. 1.

Referring to FIG. 1, a semiconductor substrate 10 is provided. For example, the semiconductor substrate 10 may be a silicon substrate or other suitable semiconductor substrate such as a Ga—As substrate, a SiC substrate and so on. The semiconductor substrate 10 includes a first surface 11 and a second surface 12 opposite to the first surface 11. For example, the first surface 11 is an active surface on which an integrated circuit 13 is disposed, and the second surface 12 is a backside surface opposite to the first surface 11.

The semiconductor device 1 may include the integrated circuit 13 formed on the first surface 11 of the semiconductor substrate 10. The type of integrated circuit 13 may vary according to the type of semiconductor device 1. For example, the integrated circuit 13 may include a memory circuit, e.g., a memory cell, a component of a logic circuit, or a combination thereof. Alternatively, the integrated circuit 13 may be a passive device including resistors or capacitors.

A via hole 16 spaced apart from the integrated circuit 13 is provided in the semiconductor substrate 10. The via hole 16 may be formed to overlap a chip pad or bonding pad 71. Alternatively, the via hole 16 may be formed in a peripheral circuit area or a scribe lane area. The via hole 16 may have substantially the same width or diameter from the first surface 11 to the second surface 12 of the semiconductor substrate 10 in cross-sectional view. Alternatively, the via hole 16 may have different widths or diameters, or may be tapered from the first surface 11 to the second surface 12 of the semiconductor substrate 10.

A through electrode 20 is provided to fill at least a portion of the via hole 16. The through electrode 20 may be connected to the integrated circuit 13 of the semiconductor device 1 or may be used to connect the semiconductor device 1 to another semiconductor device, or to connect the semiconductor device 1 to a package substrate or a module substrate. The through electrode 20 may include a barrier layer 24 formed on the inner wall of the via hole 16, and a conductive connector 26 formed on the barrier layer 24.

The conductive connector 26 may fill at least a portion of the via hole 16. A top surface 28 of the conductive connector 26 may be exposed through the second surface 12 of the semiconductor substrate 10, and may have substantially the same height as an adjacent region of the second surface 12 of the semiconductor substrate 10. Alternatively, a height of the top surface 28 of the conductive connector 26 may be lower than a height of an adjacent region of the second surface 12 of the semiconductor substrate 10 depending on the application.

A via hole insulating layer 22 may be provided between the semiconductor substrate 10 (exposed by the via hole 16) and the barrier layer 24. For example, the via hole insulating layer 22 may include a silicon oxide layer ($SiO_x$), a silicon nitride layer ($Si_xN_y$), or a silicon oxynitride layer ($SiO_xN_y$). The barrier layer 24 may be made of a material capable of preventing a conductive material forming the conductive connector 26 from being diffused into the semiconductor substrate 10. For example, the barrier layer 24 may include titanium (Ti), tantalum (Ta), titanium nitride (TiN) or tantalum nitride (TaN). The conductive connector 26 may include copper (Cu), tungsten (W), aluminum (Al), silver (Ag), gold (Au), indium (In) or polysilicon. The via hole insulating layer 22, the barrier layer 24, and the conductive connector 26 may be collectively referred to as a through via 23.

In some embodiments, top surfaces of the barrier layer 24 and the via hole insulating layer 22 are positioned at substantially the same height as a neighboring region of the second surface 12 of the substrate 10.

In another embodiment, the top surface 91 of the via hole insulating layer 22 may be substantially coplanar with a bottommost portion of the second surface 12.

A redistribution trench 103 may be formed on the second surface 12 of the semiconductor substrate 10. In other words, the second surface 12 may define the redistribution trench 103. A redistribution layer 45 may be provided to fill at least a portion of the trench 103 and to be electrically connected to the through via 23. That is to say, the redistribution layer 45 may be formed by a damascene process. A top surface 46 of the redistribution layer 45 may be positioned at substantially the same height as or lower than a topmost surface of an insulation layer pattern 35. In other words, a top surface 77 of the insulation layer pattern 35 may be substantially coplanar with the top surface 46 of the redistribution layer 45.

The redistribution layer 45 is buried in the trench 103 formed in the second surface 12 of the semiconductor substrate 10, thereby planarizing the semiconductor device 1 having the redistribution layer 45, and lowering the height of the semiconductor device 1. The redistribution layer 45 may be formed by a plating process and may be made of the same conductive materials as the conductive connector 26.

Also, the through via 23 may be disposed below the redistribution layer 45 as shown in FIG. 1, for example. In addition, the top surface 28 of the conductive connector of the through via 23 may be contiguous with a bottommost surface of the redistribution layer 45.

Referring to FIG. 3, the redistribution layer 45 is electrically connected to the through electrode 20. In one embodiment, the redistribution layer 45 may directly contact the region of the conductive connector 26 of the through via 23 exposed through an opening 33 (FIG. 2) of the insulation layer pattern 35.

In addition, even when a connection terminal 83 of an additional semiconductor device (not illustrated) connected to the semiconductor device 1 is not formed corresponding to, i.e., directly overlying, the location of the through electrode 20, the redistribution layer 45 may still allow the connection terminal 83 to be electrically coupled to the through electrode 20 therethrough. The additional semiconductor device may be connected to the semiconductor device 1 using the redistribution layer 45 and the connection terminal 83.

An insulation layer pattern 35 may be provided between a region of the second surface 12 of the semiconductor substrate 10 defining the trench 103 and the redistribution layer 45. The insulation layer pattern 35 may be formed on a portion of an inner wall of the trench 103.

In some embodiments, the insulation layer pattern 35 may directly contact the second surface 12 of the substrate 10, and the redistribution layer 45 may be formed on the insulation layer pattern 35.

In some embodiments, the insulation layer pattern 35 may include a silicon oxide layer, a silicon nitride layer, or a silicon oxynitride layer, or combinations thereof. The insulation layer pattern 35 may be conformally formed along the second surface 12 of the semiconductor substrate 10 and exposes a predetermined region of the top surface 28 of the conductive connector 26 of the through via 23. Specifically, the insulation layer pattern 35 defines an opening 33 (FIG. 2) that exposes a region of the top surface 28 of the conductive connector 26 of the through via 23 according to an embodiment the inventive concept.

A width w2 of the predetermined region of the top surface 28 of the conductive connector 26 or the through via 23 exposed through the insulation layer pattern 35 may be smaller than a width w1 of the via hole 16 or a width w3 of the conductive connector 26. Also, the width w2 of the opening 33 may be smaller than the width w3 of the conductive connector 26.

Therefore, the opening 33 of the insulation layer pattern 35 may be disposed above an area defined by the top surface 28 of the conductive connector 26. The insulation layer pattern 35 may cover a portion, e.g., an edge portion, of the top surface of the through via 23 exposed through the second surface 12 of the semiconductor substrate 10. A portion of the insulation layer pattern 35 may overlap a predetermined region of the through via 23, for example, a predetermined region of the conductive connector 26.

In some embodiments, a bottom surface of the insulation layer pattern 35 is contiguous with a top surface 91 of the via hole insulating layer 22.

In some embodiments, the insulation layer pattern 35 may cover an interface region between the second surface 12 of the substrate 10 and the top surface 91 of the via hole insulating layer 22 as explained further below.

Referring to FIG. 2, a sidewall 36 of the insulation layer pattern 35 overlying the through via 23 may be spaced apart from an inner wall 17 of the via hole 16 and may be positioned on the conductive connector 26. The width w2 of the predetermined region of the top surface 28 of the conductive connector 26 of the through via 23 exposed through the insulation layer pattern 35 may be smaller than the width w3 of the conductive connector 26.

If the insulation layer 35' is patterned such that a sidewall 36 of the insulation layer pattern 35 is located on the conductive connector 26, the via hole insulating layer 22 and the barrier layer 24 are not exposed during the formation of the insulation layer pattern 35. Thus, it is possible to help prevent the via hole insulating layer 22 and the barrier layer 24 from being damaged. It is therefore also possible to help prevent a material forming the conductive connector 26 from being permeated into the substrate 10, which could result from damage to the via hole insulating layer 22 and the barrier layer 24. Accordingly, it is possible to help prevent characteristics of the semiconductor device 1 from being degraded. In addition, when a portion of the insulation layer 35' on the through via 23 is removed, the via hole insulating layer 22 can be protected from damage. Thus, in the subsequent process of forming the redistribution layer 45 in the trench 103, it is possible to block the material forming the redistribution layer 45 from being permeated into a region from which the via hole insulating layer 22 is removed. Therefore, the substrate 10 and the through electrode 20 can be prevented from being shorted. The integrated circuit 13 may be electrically connected to the chip pad 71 and the through electrode 20 through an internal wiring layer 50. The internal wiring layer 50 includes a wiring pattern 52 and contact plugs 51 and 53. The through electrode 20 may also be electrically connected to the chip pad 71 or the integrated circuit 13 through the internal wiring layer 50. The numbers and locations of the wiring pattern 52 and the contact plugs 51 and 53 may vary according to locations of the integrated circuit 13, the through via 23, and the chip pad 71.

In one embodiment, a second insulating layer 60 covering the internal wiring layer 50 may be provided. For example, the second insulating layer 60 may be a passivation layer for protecting an interlayer dielectric layer (not illustrated) or the integrated circuit 13. The internal wiring layer 50 may be formed under or within the second insulating layer 60. In addition, the internal wiring layer 50 may be formed such that it is buried in a through hole formed in the second insulating layer 60. The second insulating layer 60 may include a first sub-insulating layer 61 and a second sub-insulating layer 62 sequentially formed on the first surface 11 of the semiconductor substrate 10. The through via 23 may be in the form of a via middle penetrating through a portion of the second insulating layer 60, for example, the first sub insulating layer 61. The through via 23 may be formed during formation of the integrated circuit 13 and the internal wiring layer 50. However, the through via 23 may be formed as a via last depending on the application.

A third insulating layer 72 exposing the chip pad 71 may be formed on the second insulating layer 60.

In one embodiment, a protective layer 63 formed of a dielectric material may be formed over the semiconductor substrate 10 including the redistribution layer 45. The protective layer 63 may have an opening part 89 (FIG. 24) exposing a portion of the redistribution layer 45 such that the connection terminal 83 can be mounted thereon. As a result, the connection terminal 83 can be electrically coupled to the redistribution layer 45 and to the through via 23.

A first connection terminal 73 for a connection with an external apparatus may be provided on the first surface 11 of the semiconductor substrate 10. The first connection terminal 73 may be at least one selected from the group consisting of a conductive bump, a solder ball, a conductive spacer, a pin grid array (PGA), and combinations thereof. The first connection terminal 73 may connected to the chip pad 71.

Another embodiment, which is a modification from the semiconductor device shown in FIG. 1, will now be described with reference to FIGS. 4 and 5. Here, substantially the same elements as those of FIG. 1 are denoted by identical reference numerals, and detailed descriptions thereof will be omitted.

Figure 4:
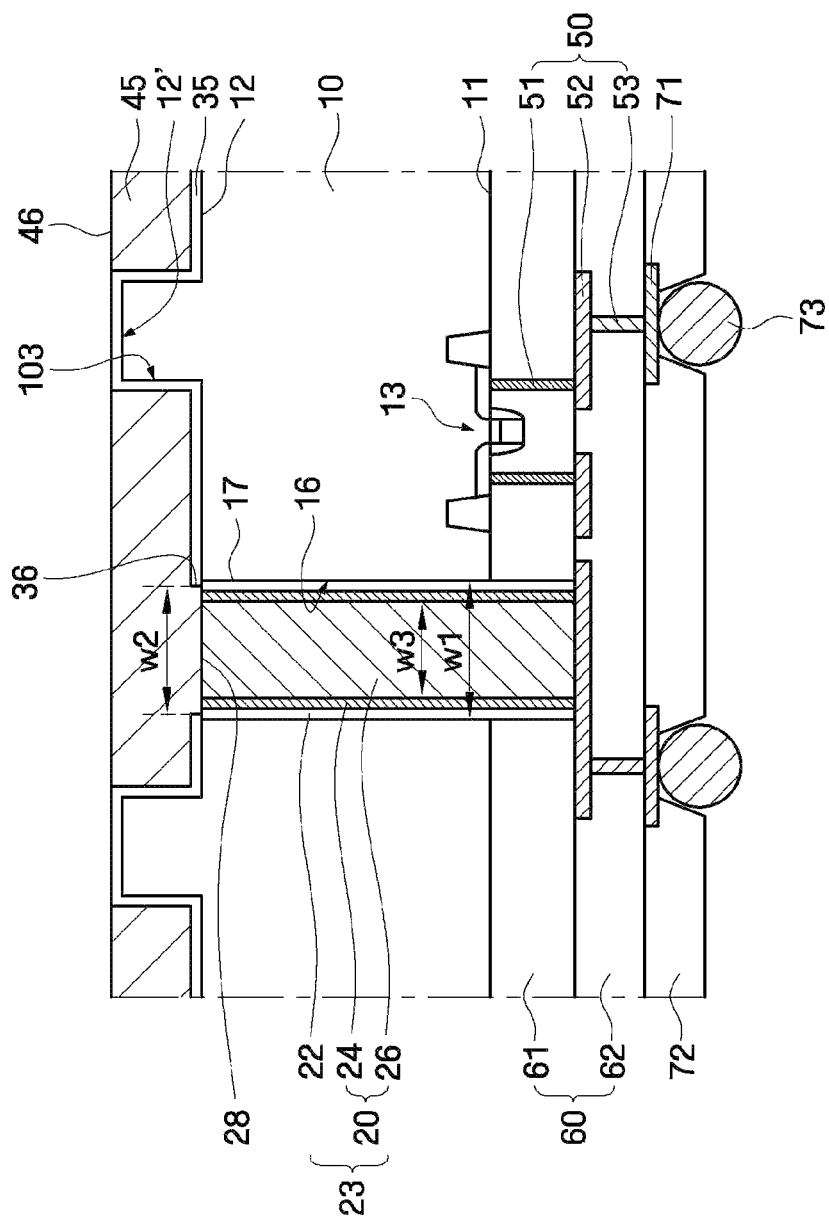
FIGS. 4 and 5 are cross-sectional views illustrating a modification from the semiconductor device shown in FIG. 1.

Referring to FIG. 4, a sidewall 36 of an insulation layer pattern 35 may be positioned on a via hole insulating layer 22. For example, the sidewall 36 of the insulation layer pattern 35 may be positioned on the top surface 91 of the via hole insulating layer 22. If the insulation layer pattern 35 is formed to cover an interface region between the via hole insulating layer 22 and a semiconductor substrate 10 without exposing the entire top surface of the through via 23. In other words, when the top surface of the through via 23 is exposed through a second surface 12 of the semiconductor substrate 10 during removal of the insulation layer 35' on the through via 23 to form the insulation layer pattern 35, the via hole insulating layer 22 may not be removed at the interface between the semiconductor substrate 10 and the via hole insulating layer 22, thereby protecting the semiconductor substrate 10 and the through electrode 20 from being shorted.

Figure 5:
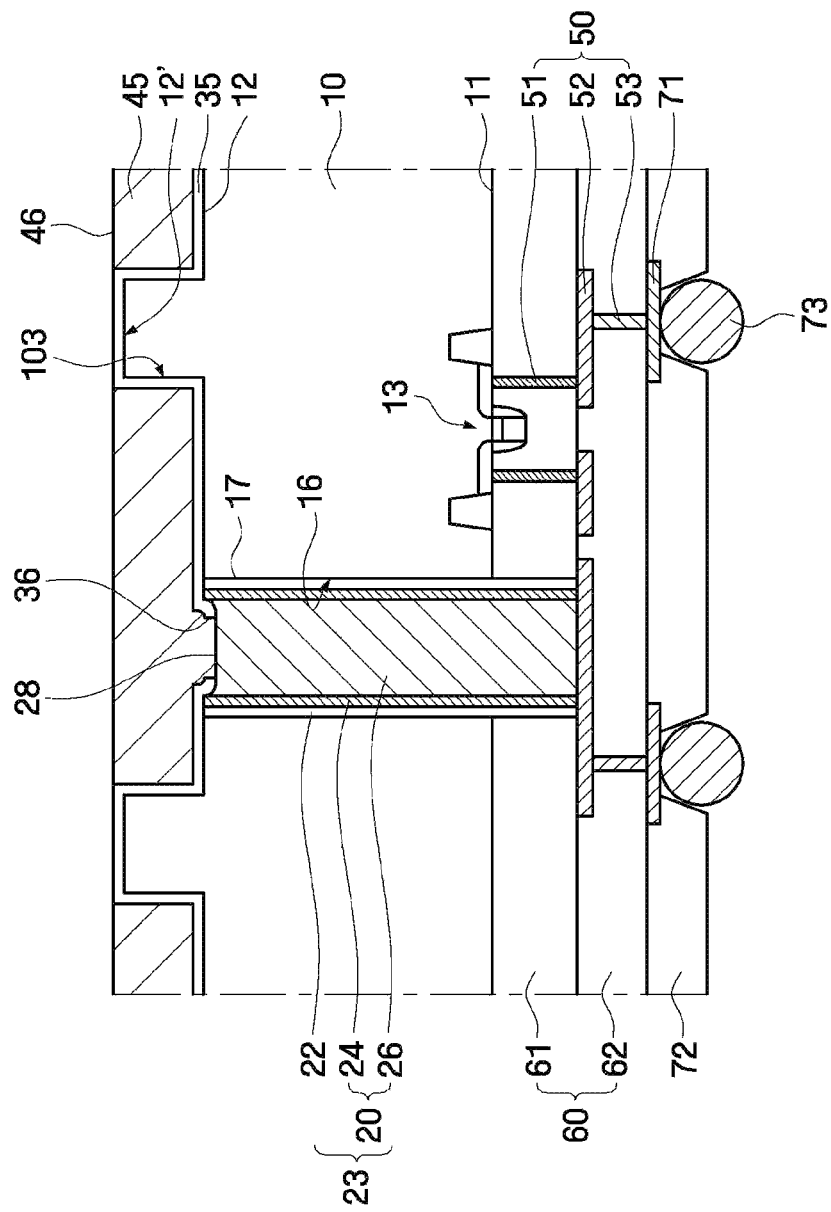

Referring to FIG. 5, at least a portion of a top surface 28 of a conductive connector 26 exposed through the insulation layer pattern 35 may be lower than top surfaces of the via hole insulating layer 22 and the barrier layer 24. When a trench 103 is formed in the initial surface 12' of the semiconductor substrate 10, the barrier layer 24 on the top surface 28 of the conductive connector 26 is removed and the top surface 28 of the conductive connector 26 may also be slightly removed.

Figure 6:
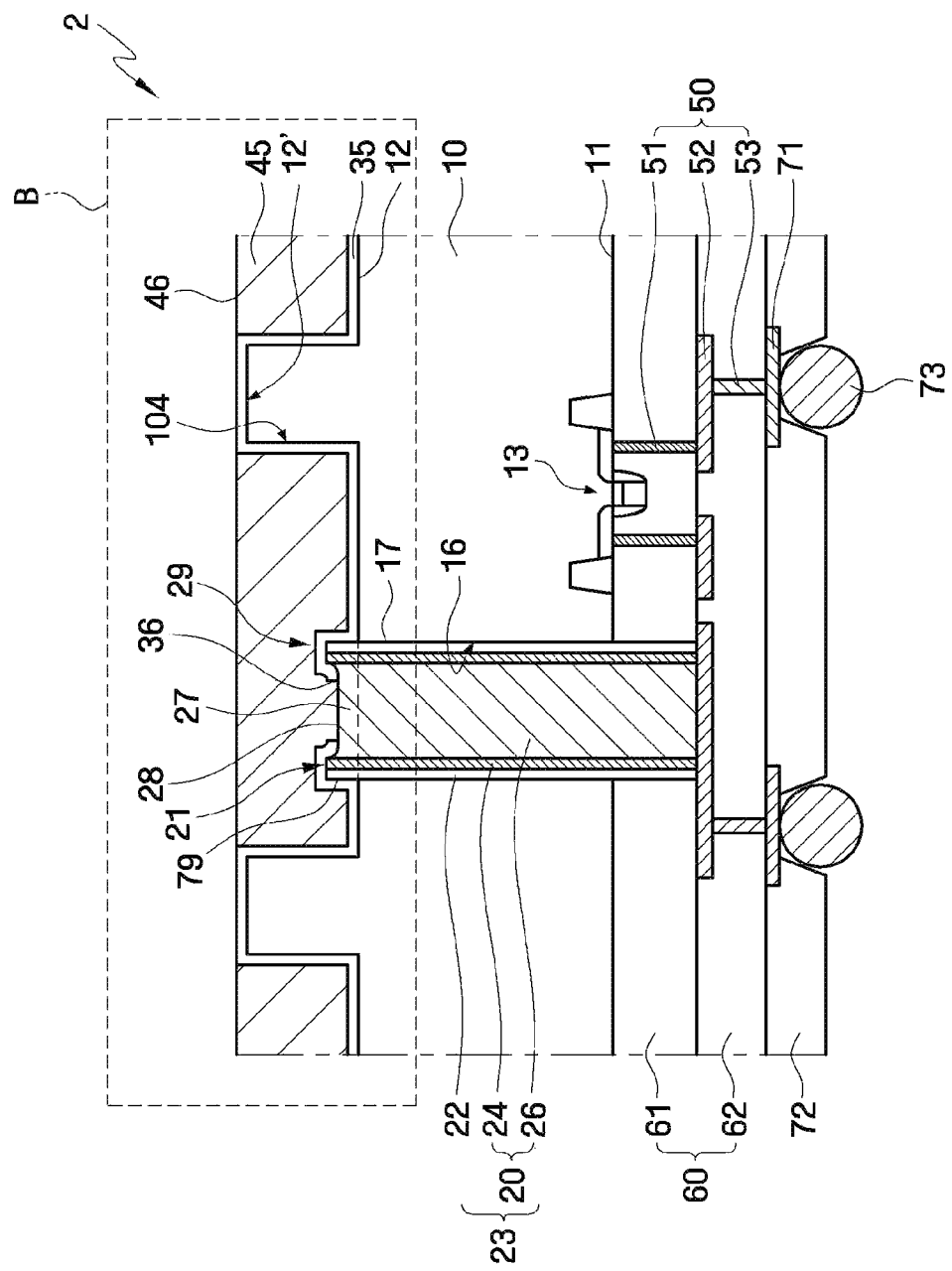
FIG. 6 is a cross-sectional view illustrating a semiconductor device according to another embodiment of the inventive concept.

A semiconductor device according to another embodiment of the inventive concept will now be described with reference to FIG. 6. FIG. 6 is a cross-sectional view illustrating a semiconductor device according to another embodiment of the inventive concept. Here, substantially the same elements as those of FIG. 1 are denoted by identical reference numerals, and detailed descriptions thereof will be omitted.

Referring to FIG. 6, a through via 23 of a semiconductor device 2 may include an elevated portion 27 of a conductive connector 26 that extends above the level of the neighboring region of a second surface 12 of a semiconductor substrate 10. That is to say, a top surface of a conductive connector 26 is higher than the second surface 12 of the semiconductor substrate 10 in the neighboring region, for example, the bottommost part of the second surface 12 of the semiconductor substrate 10.

According to an embodiment of the present disclosure, a top surface 28 of the elevated portion 27 of the conductive connector 26 may be disposed below a top surface 46 of the redistribution layer 45.

In some embodiments, an extended part 21 of the via hole insulating layer 22 extends above a bottommost portion of the second surface 12. The insulation layer pattern 35 may cover a sidewall 79 of the extended part 21 of the via hole insulating layer 22.

The insulation layer pattern 35 formed on the sidewall 79 of the elevated part 23 of the via hole insulating layer 22 of the through via 23 may also be formed on a predetermined region of a top surface 28 of the elevated portion 27 of the conductive connector 26 exposed through the second surface 12 of the semiconductor substrate 10. A sidewall 36 of the insulation layer pattern 35 is spaced apart from an inner wall 17 of a via hole 16 and may be positioned on the through via 23. For example, the sidewall 36 of the insulation layer pattern 35 may be positioned on the top surface 28 of the conductive connector 26. In the semiconductor device 2, the elevated portion 27 of the conductive connector 26 may be used as a portion of the redistribution layer 45. Here, if the conductive connector 26 and the redistribution layer 45 are made of the same metal, the metal forming the conductive connector 26 is thermally processed in the course of manufacturing the semiconductor device 2. Accordingly, resistance of the metal forming the conductive connector 26 may be smaller than that of the metal forming the redistribution layer 45. Therefore, if the through via 23 protrudes from the second surface 12 of the semiconductor substrate 10, the redistribution layer 45 having relatively small resistance can be implemented. Alternatively, the redistribution layer 45 may be formed of a material that is different from the material that forms the conductive connector 26.

In addition, if the through via 23 is formed to have the elevated portion 27, since the top surface 28 of the conductive connector 26 protrudes above the second surface 12 of the semiconductor substrate 10, an etching process margin can be increased during etching for removing a portion of an insulation layer to form the insulation layer pattern 35 on the through via 23.

In some embodiments, the insulation layer pattern 35 may form a ridge 29 rising above a level of the second surface 12 of the semiconductor substrate 10 and extends over the via hole insulating layer 22 and the barrier layer 24.

Figure 7:
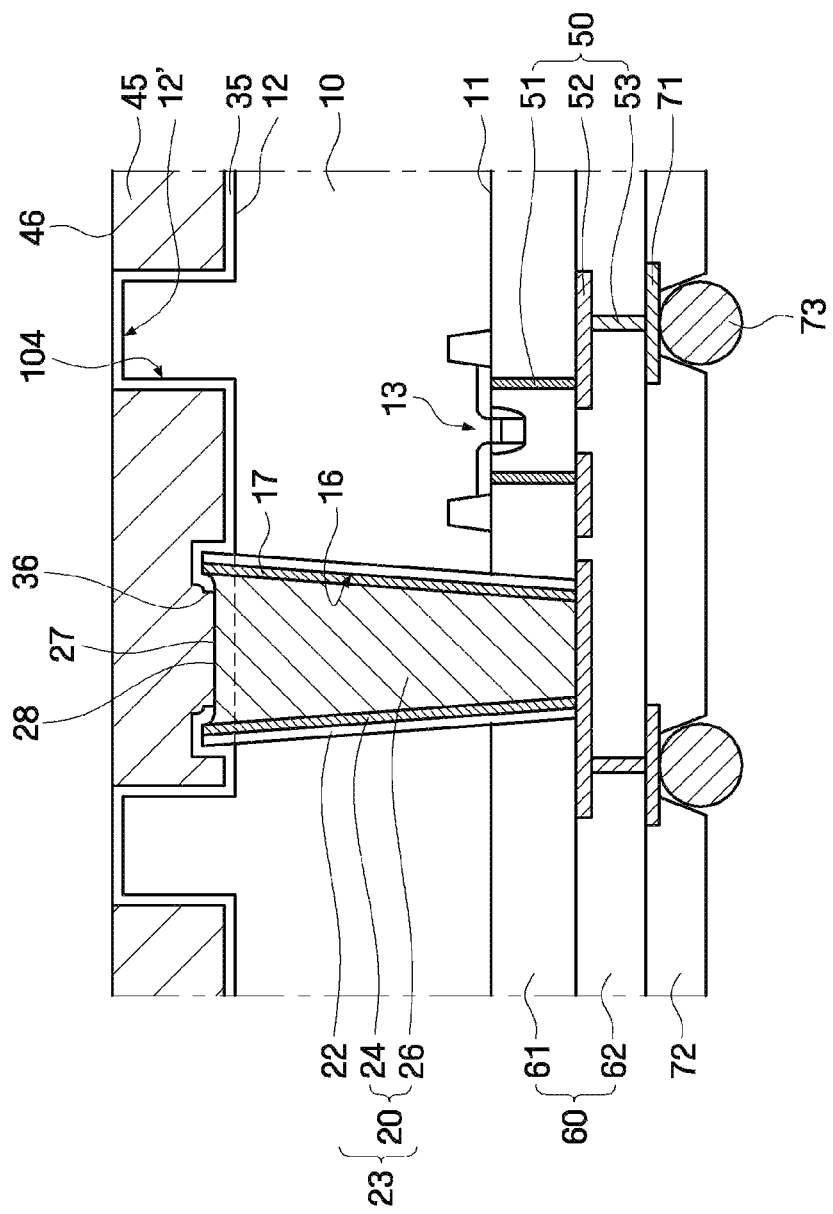
FIG. 7 is a cross-sectional view illustrating a modification from the semiconductor device shown in FIG. 6.

A modification example of the semiconductor device shown in FIG. 6 will now be described with reference to FIG. 7. FIG. 7 is a cross-sectional view illustrating a modification example of the semiconductor device shown in FIG. 6. Here, substantially the same elements as those of FIG. 6 are denoted by identical reference numerals, and detailed descriptions thereof will be omitted.

Referring to FIG. 7, a through via 23 may be tapered such that its width gradually increases from the first surface 11 to the second surface 12 of the semiconductor substrate 10. If the through via 23 has a relatively greater width on the second surface 12, contact resistance between the through via 23 and a redistribution layer 45 can be reduced. However, the through via 23 has a smaller width at the first surface 11 of the semiconductor substrate 10 than at the second surface 12 of the semiconductor substrate 10, thereby preventing an area of an active region from being decreased.

Figure 30:
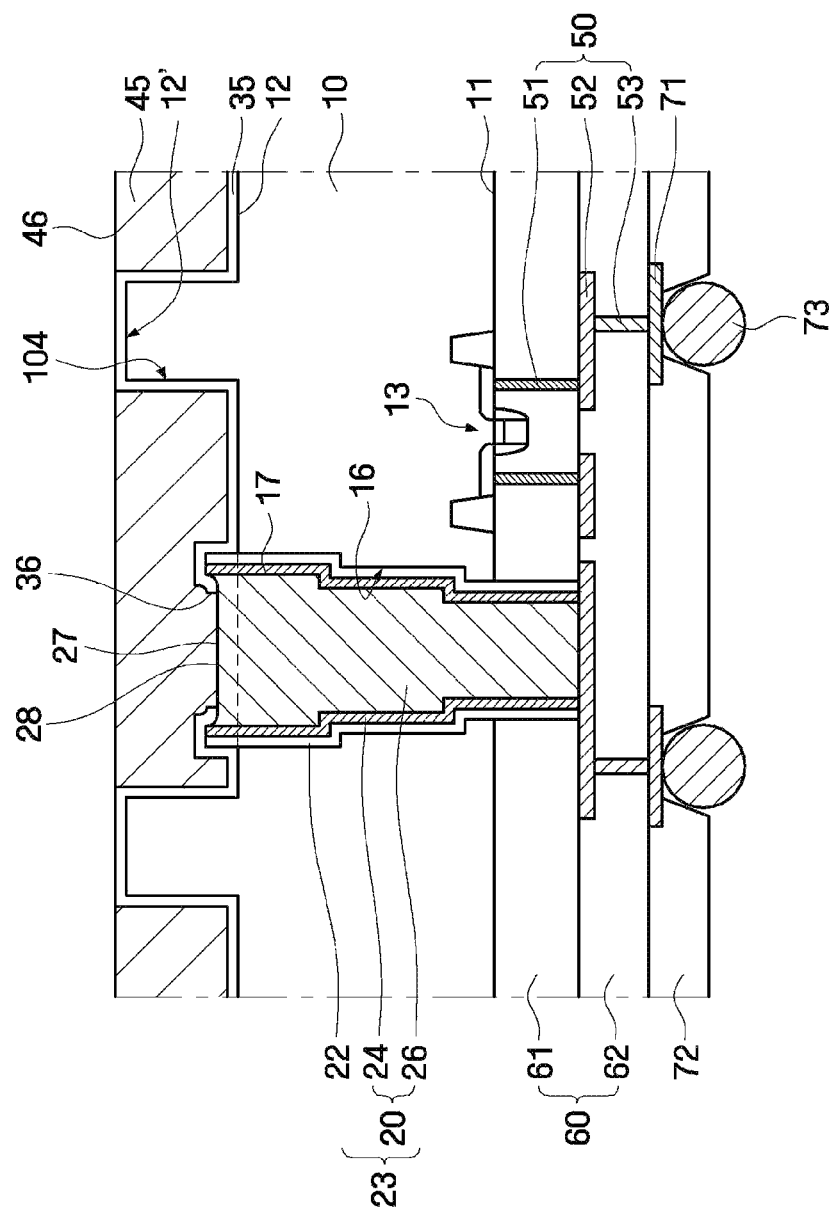
FIG. 30 is a cross-sectional view illustrating a semiconductor device according to an embodiment of the inventive concept.

In some embodiments, the through via 23 may be stepwise tapered in cross-sectional view as shown in FIG. 30.

Figure 31:
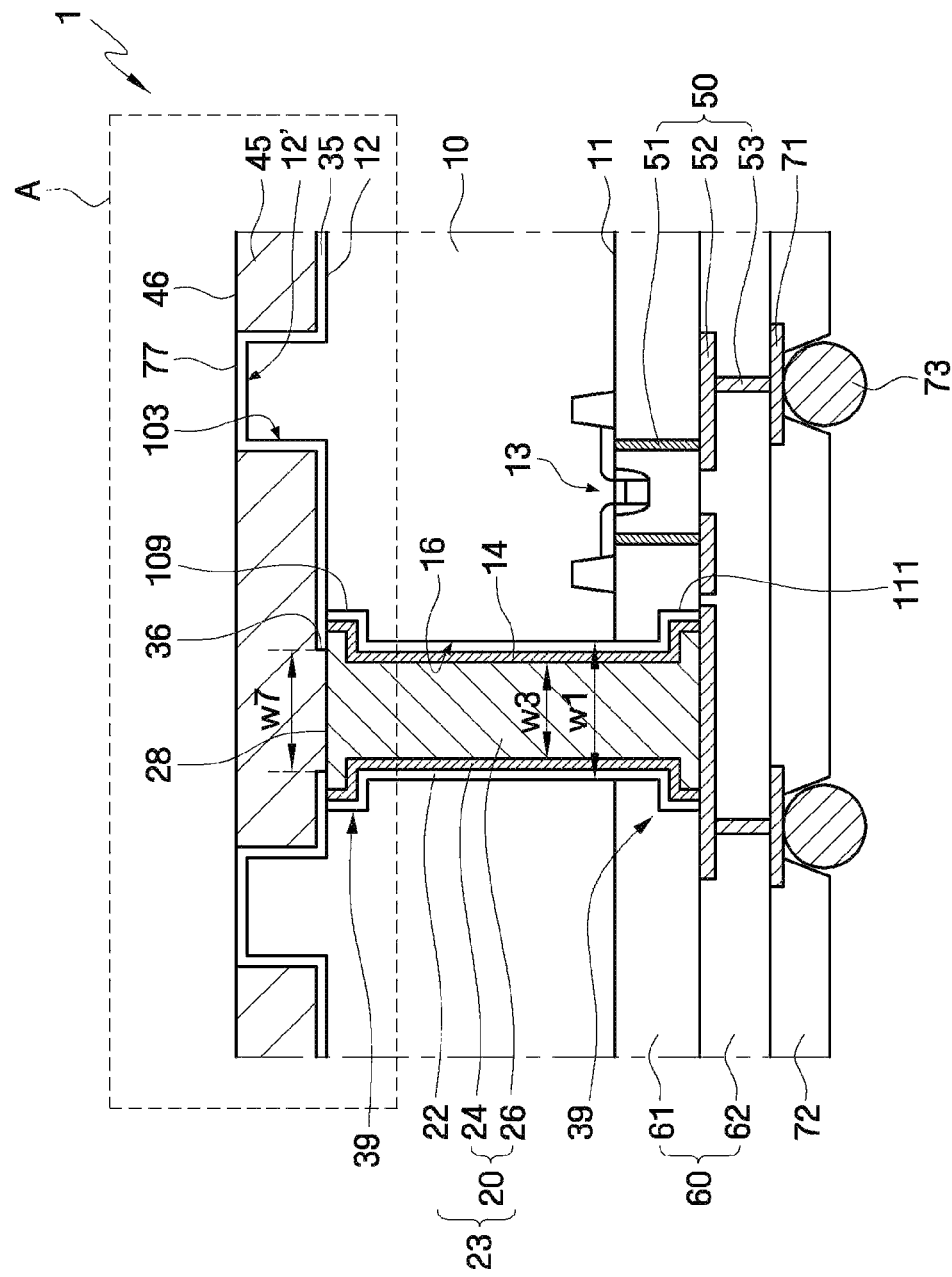
FIG. 31 is a cross-sectional view illustrating of a semiconductor device according to another embodiment of the inventive concept.

In another embodiment, the through via 23 may have a step 39 in cross-sectional view as shown in FIG. 31. With these embodiments of the present disclosure, contact resistance can be reduced because the contact area between the redistribution layer 45 and the conductive connector 26 can be increased with these embodiments. One skilled in the art will appreciate how to form such structures. For example, an interconnection trench 109 can be formed in the upper part of the via hole 16 to form the step 39, after the via hole 16 is formed. Alternatively, the via hole 16 may be formed after the interconnection trench 109 is formed. The width w7 of the interconnection trench may be greater than the width w1 of the via hole 16. In addition, additional interconnection trench 111 can be optionally formed in the lower part of the via hole 16 as shown.

While FIG. 7 illustrates a modified example of FIG. 6 in which the through via 23 is tapered, the tapered through via 23 may also be applied to other semiconductor devices described in the specification of the inventive concept.

Figure 8:
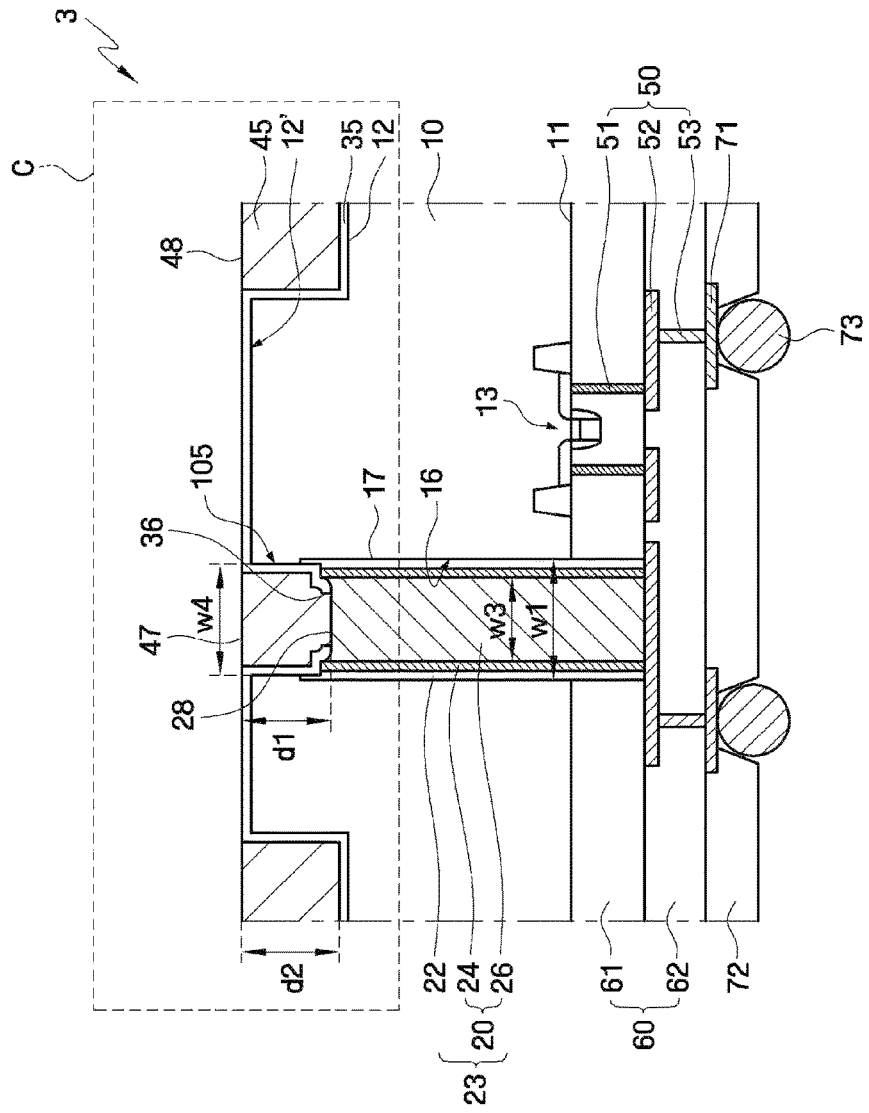
FIG. 8 is a cross-sectional view illustrating a semiconductor device according to still another embodiment of the inventive concept.
Figure 9:
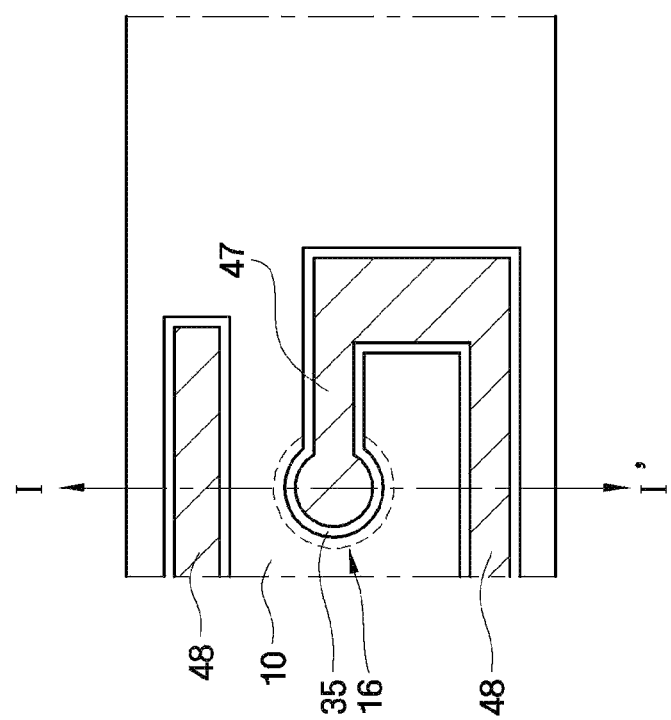
FIG. 9 is a plan view illustrating a portion of the semiconductor device shown in FIG. 8.

A semiconductor device according to still another embodiment of the inventive concept will now be described with reference to FIGS. 8 and 9. FIG. 8 is a cross-sectional view illustrating a semiconductor device according to still another embodiment of the inventive concept, and FIG. 9 is a plan view illustrating a portion of the semiconductor device shown in FIG. 8. FIG. 8 is a cross-sectional view taken along line I-I' of FIG. 9. Here, substantially the same elements as those of FIG. 1 are denoted by identical reference numerals, and detailed descriptions thereof will be omitted.

Referring to FIGS. 8 and 9, a width w4 of a trench 105 formed over a through via 23 and exposing the through via 23 may be smaller than a width w1 of a via hole 16. As a result, a portion of a top surface 92 (FIG. 2) of a via hole insulating layer 22 may not be exposed through a second surface 12 of a semiconductor substrate 10. That is, an insulation layer pattern 35 may be positioned on the inner wall of the trench 105 and not on a top surface 28 of the through via 23. Alternatively, the insulation layer pattern 35 may be positioned to extend to a portion of the top surface 28 of the through via 23. For example, a sidewall 36 of the insulation layer pattern 35 may be positioned on a conductive connector 26.

In some embodiments, the insulation layer pattern 35 may extend vertically along a portion of the via hole insulating layer 22. Also, the insulation layer pattern may cover a top surface of the barrier layer 24.

A redistribution layer 45 may include a first sub redistribution layer 47 overlapping with the through via 23 and a second sub redistribution layer 48 not overlapping with the through via 23. Here, the first sub redistribution layer 47 and the second sub redistribution layer 48 may have different thicknesses. In an exemplary embodiment, a thickness d2 of the second sub redistribution layer 48 may be greater than a thickness d1 of the first sub redistribution layer 47.

In some embodiments, a width of the first sub redistribution layer 47 may be smaller that the width w1 of the via hole 16.

A fabricating method of a semiconductor device according to an embodiment of the inventive concept will now be described with reference to FIGS. 10 to 14 together with FIG. 1. FIGS. 10 to 14 are cross-sectional views illustrating a fabricating method of a semiconductor device according to an embodiment of the inventive concept. For the sake of convenience of explanation, a portion to FIGS. 10 to 14 together with FIG. 1. FIGS. Here, substantially the same elements as those of FIG. 1 are denoted by identical reference numerals, and detailed descriptions thereof will be omitted.

Figure 10:
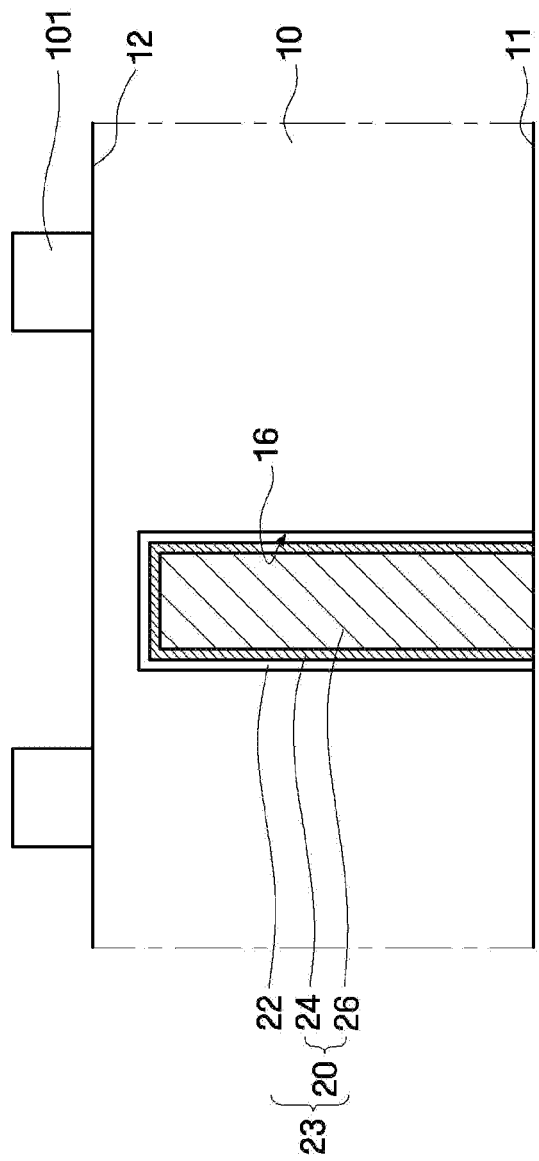
FIGS. 10 to 14 are cross-sectional views illustrating a fabricating method of a semiconductor device according to an embodiment of the inventive concept.

Referring to FIG. 10, a through electrode 20 filling a via hole 16 extending from a first surface 11 to an initial second surface or a substrate surface 12' of a semiconductor substrate 10 may be formed. The initial second surface 12' is opposite to the first surface 11. The through electrode 20 may not be exposed to the initial second surface 12'. A via hole insulating layer 22 may be formed between the semiconductor substrate 10 exposed by the via hole 16 and the through electrode 20. The formation of the through electrode 20 may include sequentially forming a barrier layer 24 and a conductive connector 26 on the via hole insulating layer 22. The via hole 16 and the through electrode 20 may be formed during the formation of an integrated circuit 13 and an internal wiring layer (50 of FIG. 1) on the semiconductor substrate 10. For example, a via hole 16 is formed in a semiconductor substrate 10. A via hole insulating layer 22 may be formed within the via hole 16. A conductive conductor layer is formed within the via hole 16 to form the conductive connector 26 extending from a first surface 11 of the semiconductor substrate 10. Then, although not shown, a planarization process is performed over the resulting structure including the conductive conductor layer to form the through via 23.

The conductive connector 26 may include copper (Cu), tungsten (W), aluminum (Al), silver (Ag), gold (Au), indium (In) or polysilicon. The conductive connector 26 made of copper (Cu) may be formed by plating. The plating may include forming a seed layer (not shown) on the barrier layer 24. The conductive connector 26 made of tungsten (W), aluminum (Al) or polysilicon may be formed using a physical vapor deposition (PVD) layer or a chemical vapor deposition (CVD) layer.

In one embodiment, a surface of the substrate 10 opposite to the first surface 11 may be grinded or planarized before forming a redistribution trench 103 (FIG. 11) to form the initial second surface or substrate surface 12'.

A first photoresist pattern 101 may be formed on the initial second surface 12' of the semiconductor substrate 10. The first photoresist pattern 101 may be formed where the redistribution layer (45 of FIG. 1) is not to be formed.

Figure 11:
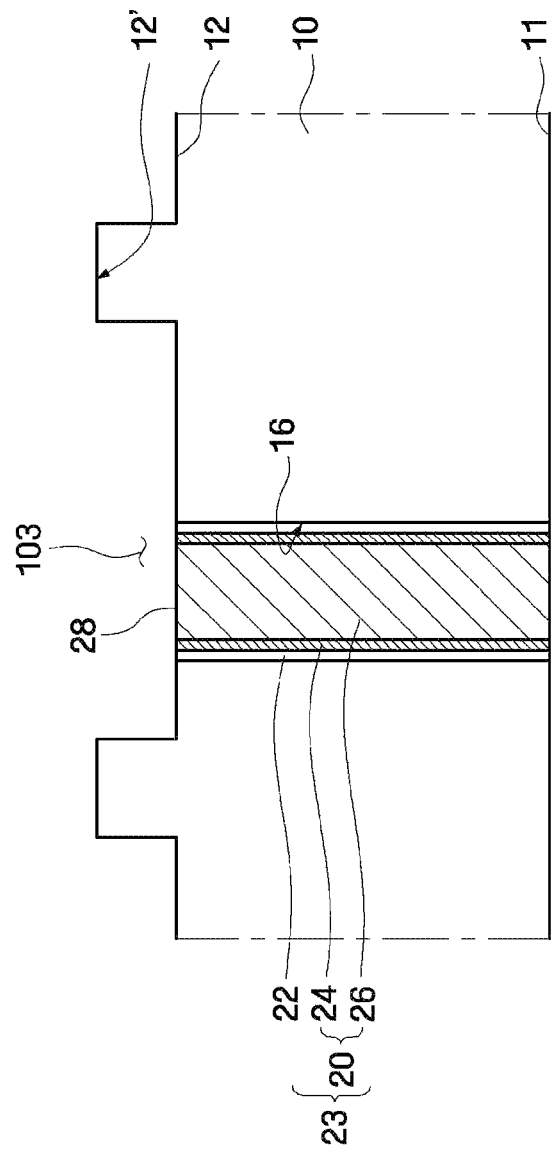

Referring to FIG. 11, the redistribution trench 103 may be formed in the initial second surface 12' of the semiconductor substrate 10 by removing a predetermined region of the semiconductor substrate 10 exposed through the first photoresist pattern 101 using the first photoresist pattern 101 as an etch mask. The etching may include dry etching. The etching may be performed to form the redistribution trench 103, thereby defining a second surface 12 of the substrate 10 until a top surface of the conductive connector 26 is exposed. The redistribution trench 103 may be connected with the via hole 16. The second surface 12 of the semiconductor substrate 10 in the trench 103 may have substantially the same height as the exposed surface of the conductive connector 26. Alternatively, the exposed surface of the conductive connector 26 may be lower than the second surface 12 of the semiconductor substrate 10 in the trench 103. After the etching, the first photoresist pattern 101 may be removed.

Figure 12:
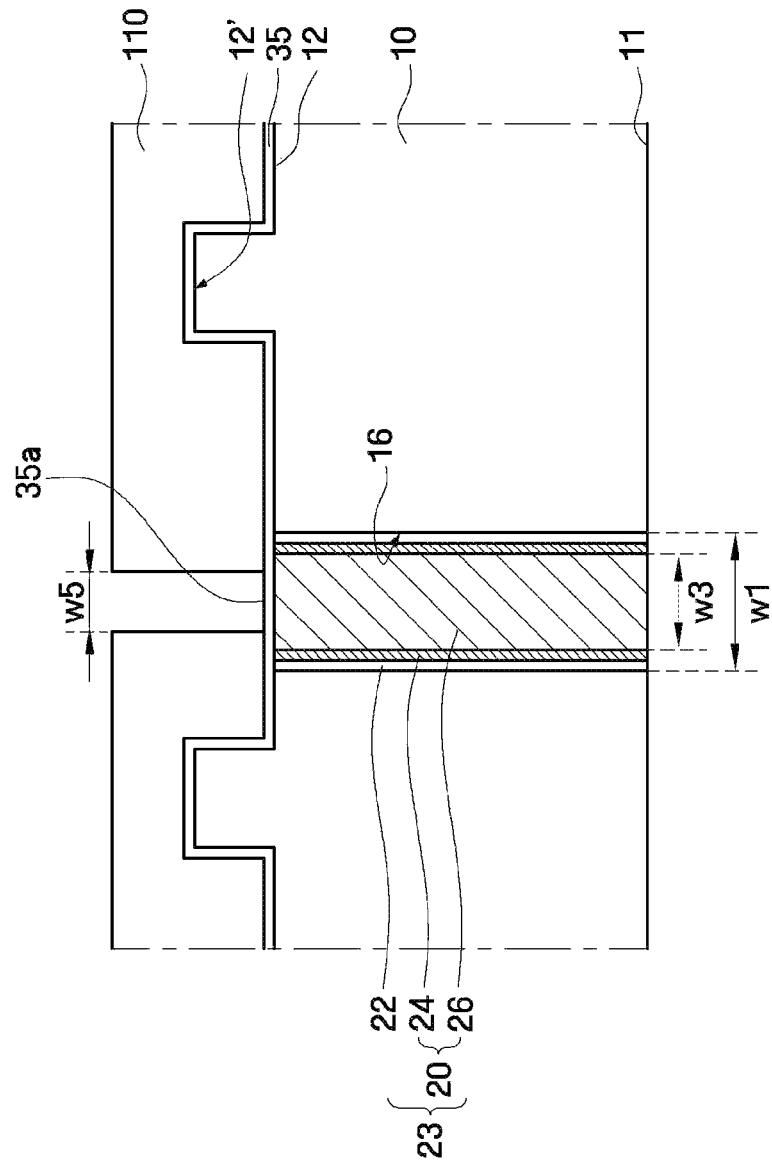

Referring to FIG. 12, an insulation layer 35' may be formed on the second surface 12 of the semiconductor substrate 10 having the trench 103. The insulation layer 35' may be formed by, for example, physical vapor deposition (PVD) or chemical vapor deposition (CVD). The insulation layer 35' may be formed on the second surface 12 of the semiconductor substrate 10. In some embodiments, the insulation layer 35' may be conformally formed on the second surface 12 of the semiconductor substrate 10. A second photoresist pattern 110 may be formed on the insulation layer 35'. The second photoresist pattern 110 may be formed at a location of a region from which the insulation layer 35' is not to be removed. A predetermined region 35a of the insulation layer 35' exposed through the second photoresist pattern 110 may be removed to form an opening 33 shown in FIG. 13. The second photoresist pattern 110 may be formed such that a width w5 of the predetermined region 35a of the insulation layer 35' is smaller than a width w1 of the via hole 16 or a width w3 of the conductive connector 26.

Figure 13:
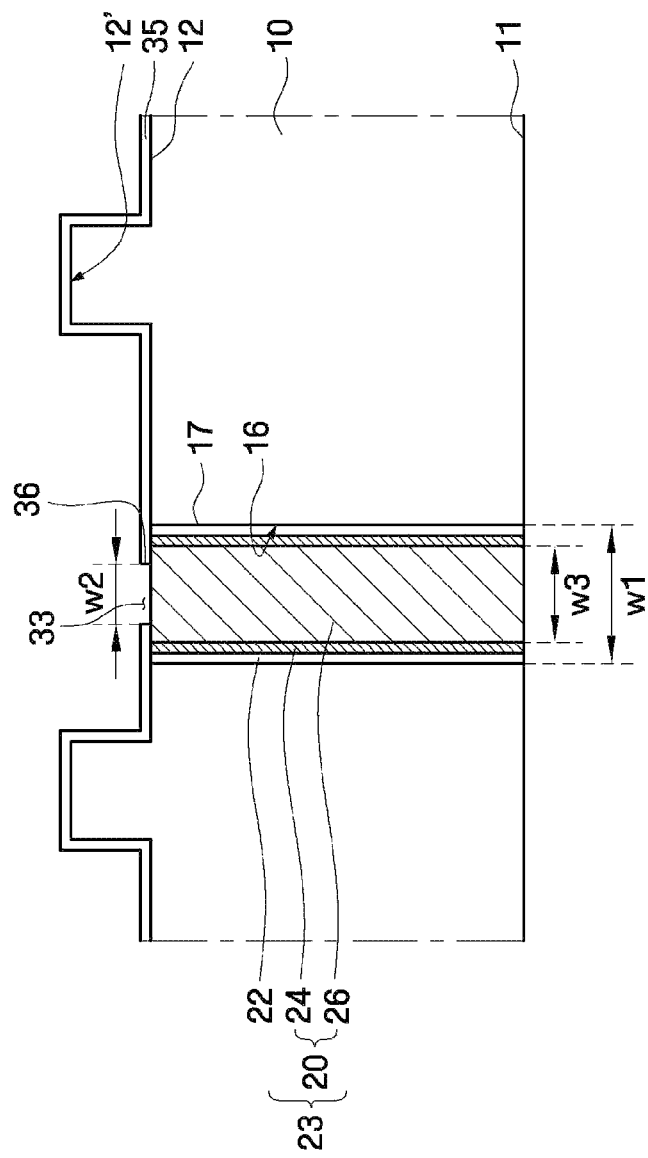

Referring to FIG. 13, the predetermined region 35a of the insulation layer 35' exposed through the second photoresist pattern 110 is etched using the second photoresist pattern 110 as an etch mask to form an insulation layer pattern 35.

In one embodiment, the insulation layer pattern 35 may be formed while leaving a portion of the insulating layer 35' covering an interface region between the second surface 12 of the substrate 10 and a top surface of the via hole insulating layer 22.

In some embodiments, the etching may include wet etching or dry etching. As a result, the insulation layer pattern 35 defines the opening 33 that exposes a region of the top surface 28 of the through via 23.

A width w2 of a predetermined region of the top surface 28 of the conductive conductor 26 of the through via 23 exposed by the first insulation layer pattern 35 may be smaller than the width w1 of the via hole 16 or the width w3 of the conductive connector 26. The first insulation layer pattern 35 may cover a portion, e.g., an edge portion, of the top surface of the through via 23 exposed through the second surface 12 of the semiconductor substrate 10. That is to say, a portion of the first insulation layer pattern 35 may overlap a portion of the through via 23, e.g., the predetermined region of the conductive connector 26. A sidewall 36 of the first insulation layer pattern 35 may be spaced apart from an inner wall 17 of the via hole 16 and may be positioned on the conductive connector 26.

If the sidewall 36 of the first insulation layer pattern 35 is formed to be positioned on the conductive connector 26, the via hole insulating layer 22 and the barrier layer 24 are not exposed while removing a portion of the insulation layer 35' to form the insulation layer pattern 35 on the through via 23. Thus, it is possible to protect the via hole insulating layer 22 and the barrier layer 24 from being damaged.

As the result, it is also possible to prevent a material forming the conductive connector 26 from being permeated into the substrate 10, which could result from damage to the via hole insulating layer 22 and the barrier layer 24. Accordingly, it is possible to prevent characteristics of the semiconductor device 1 from being degraded. In addition, when the insulation layer pattern 35 on the through via 23 is removed, the via hole insulating layer 22 can be prevented from being damaged. Thus, in the subsequent process of forming the redistribution layer 45 in the trench 103, it is possible to prevent a material forming the redistribution layer 45 from being permeated into a region from which the via hole insulating layer 22 is removed. Therefore, the substrate 10 and the through electrode 20 can be prevented from being shorted. The integrated circuit 13 may be electrically connected to the chip pad 71 and the through electrode 20 through an internal wiring layer 50.

Figure 14:
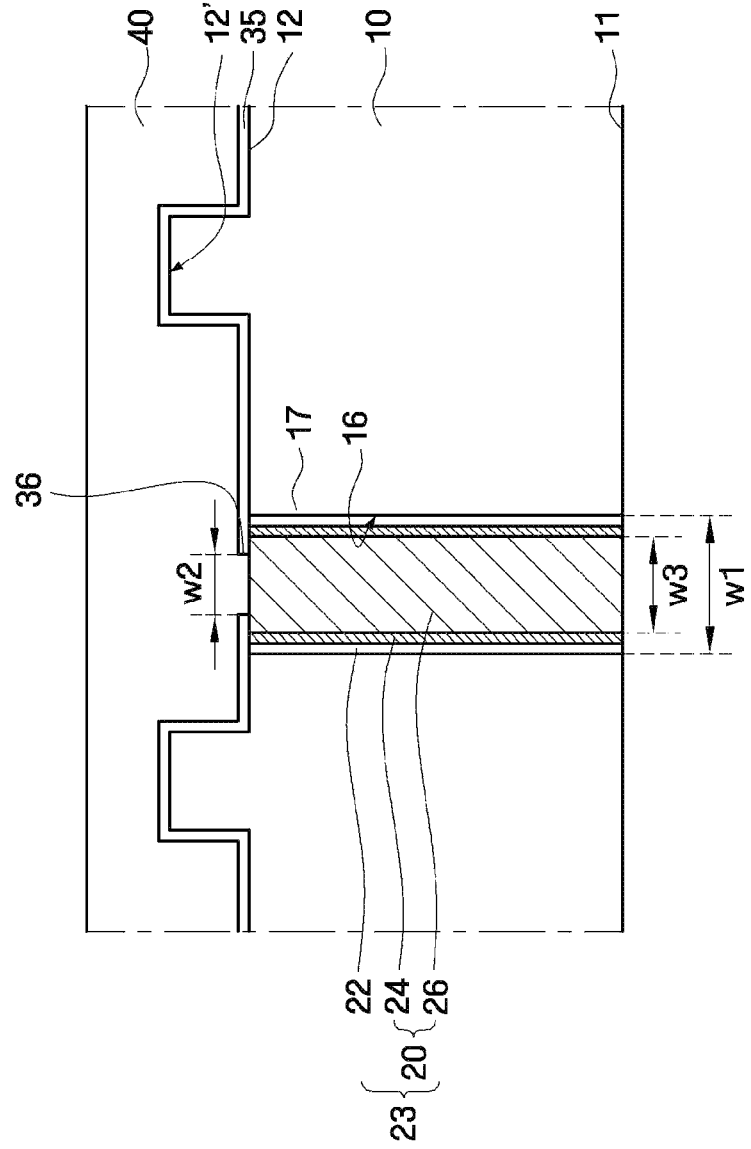

Referring to FIG. 14, a conductive layer 40 for forming a redistribution layer 45 (FIG. 1, for example) may be formed on the insulation layer pattern 35. If the redistribution layer forming conductive layer 40 is made of copper (Cu), it may be formed by plating. The plating may include forming a seed layer (not shown) on the insulation layer pattern 35. In a case where the redistribution layer forming conductive layer 40 is made of tungsten (W), aluminum (Al) or polysilicon, it may be formed using a physical vapor deposition (PVD) layer or a chemical vapor deposition (CVD) layer.

The resulting structure may be planarized using a planarization process to form the redistribution layer 45 shown in FIG. 1 until a top surface of the insulation layer pattern 35 on the initial second surface 12' of the semiconductor substrate 10 is exposed. As a result, the top surface 77 of the insulation layer pattern 35 may be substantially coplanar with a top surface 46 of the redistribution layer 45 according to an embodiment of the inventive concept. For example, the planarizing process may be a chemical mechanical polishing (CMP) process of removing the conductive layer 40. In the planarizing process, the insulation layer pattern 35 formed on the initial second surface 12' of the semiconductor substrate 10 may be used as a planarizing stopper layer. That is, the redistribution layer 45 may be formed by a damascene process. The top surface 46 of the redistribution layer 45 may be positioned at substantially the same height with as discussed or lower than the uppermost surface of the insulation layer pattern 35. As a result, the redistribution layer 45 is buried in the trench 103 formed in the second surface 12 of the semiconductor substrate 10, thereby lowering the height of the semiconductor device 1.

Figure 15:
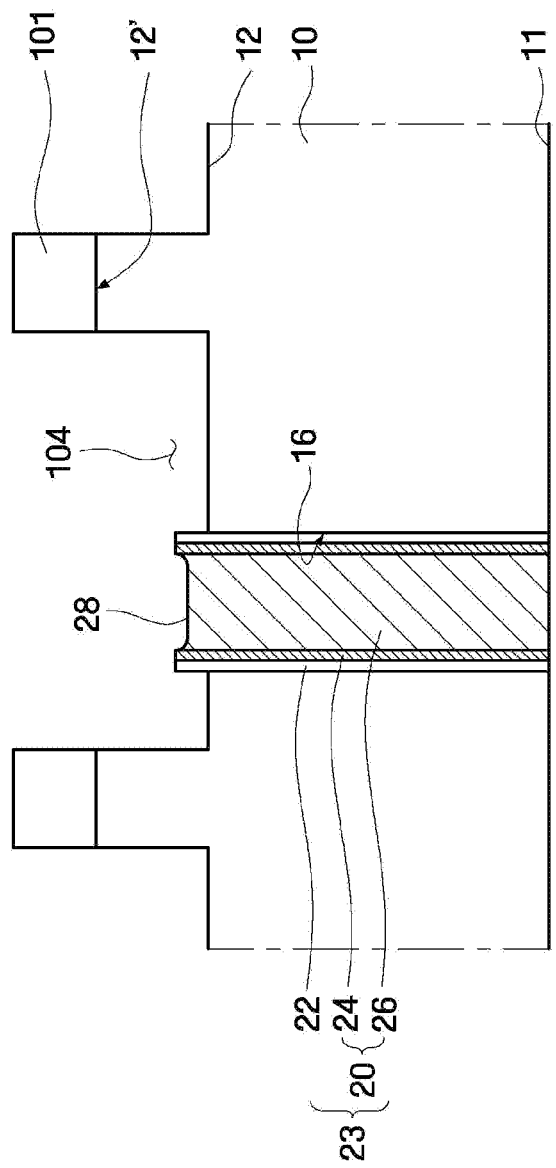
FIGS. 15 to 17 are cross-sectional views illustrating a fabricating method of a semiconductor device according to another embodiment of the inventive concept.
Figure 16:
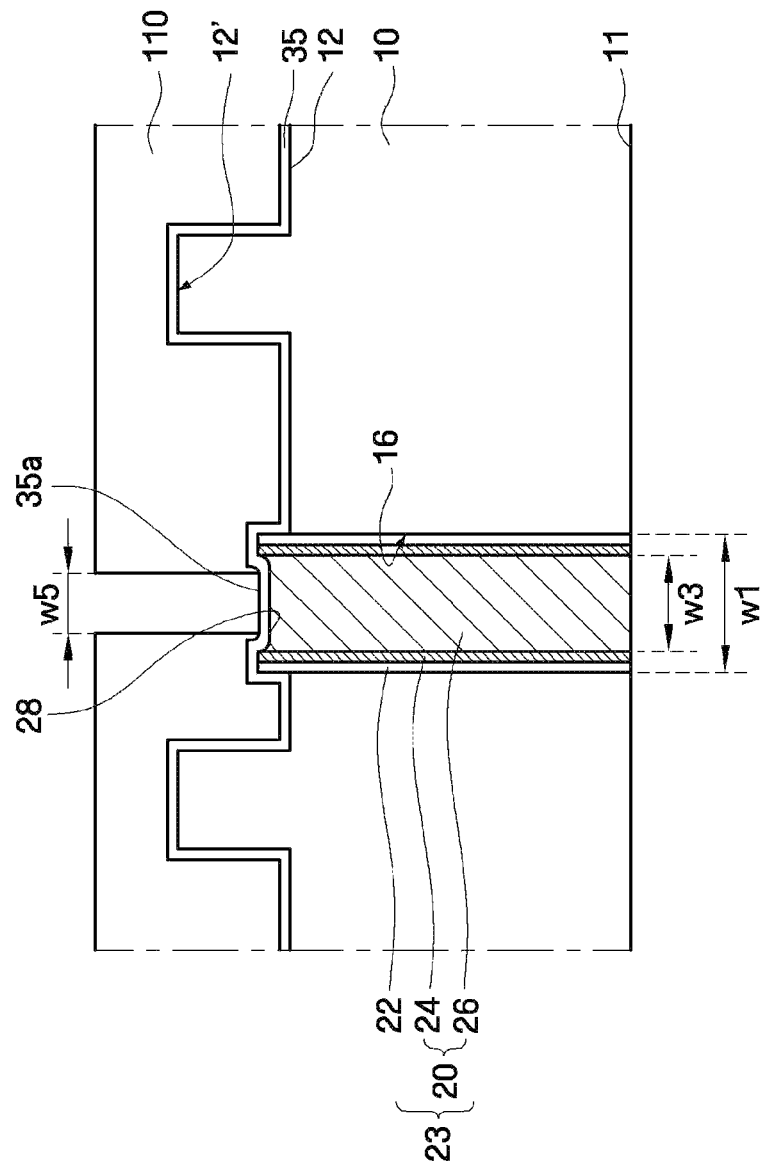
Figure 17:
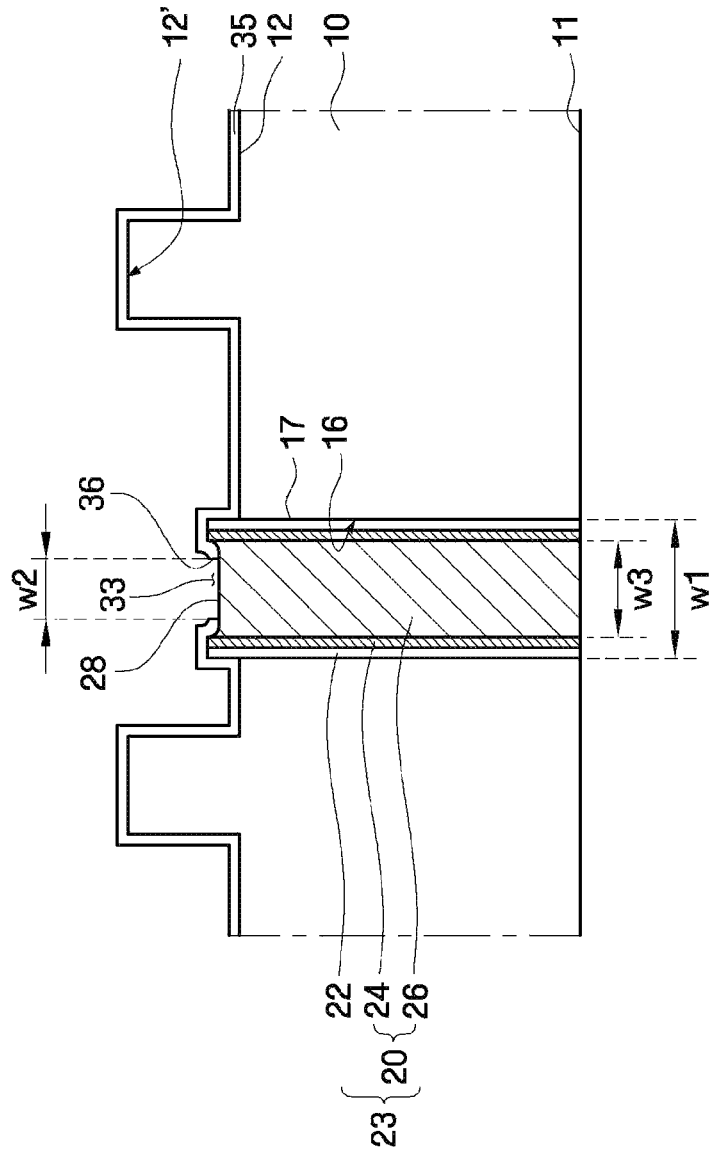

A fabricating method of a semiconductor device according to another embodiment of the inventive concept will now be described with reference to FIGS. 15 to 17 together with FIG. 6. FIGS. 15 to 17 are cross-sectional views illustrating a fabricating method of a semiconductor device according to another embodiment of the inventive concept. For convenience of explanation, a portion 'B' shown in FIG. 6 is exaggerated in FIGS. 15 to 17. Here, substantially the same elements as those of FIG. 6 are denoted by identical reference numerals, and detailed descriptions thereof will be omitted. The following description will focus on processes different from those shown in FIGS. 10 to 14.

Referring to FIG. 15, a through via 23 is formed in a semiconductor substrate 10 in the same manner as shown in FIG. 10, a first photoresist pattern 101 is formed on the initial second surface 12' of the semiconductor substrate 10. Next, a predetermined region of the semiconductor substrate 10 exposed by the first photoresist pattern 101 is removed using the first photoresist pattern 101 as an etch mask in the same manner as shown in FIG. 11, thereby forming a redistribution trench 104. Here, in order to secure an open margin enough to expose one surface, that is, a top surface 28, of the conductive connector 26, the predetermined region of the semiconductor substrate 10 may be over-etched. As the result, the through via 23 may have an elevated portion (27 of FIG. 6) rising from a second surface 12 of a semiconductor substrate 10.

Referring to FIG. 16, an insulation layer 35' may be formed on the second surface 12 of the semiconductor substrate 10 having the trench 104. The insulation layer 35' may be formed by physical vapor deposition (PVD) or chemical vapor deposition (CVD). The insulation layer 35' may be conformally formed along the second surface 12 of the semiconductor substrate 10. A second photoresist pattern 110 may be formed on the insulation layer 35'. The second photoresist pattern 110 may be formed where the insulation layer 35' is not to be removed. A predetermined region 35a of the insulation layer 35' exposed by the second photoresist pattern 110 may be removed. The second photoresist pattern 110 may be formed such that a width w5 of the predetermined region 35a of the insulation layer 35' is smaller than a width w1 of the via hole 16 or a width w3 of the conductive connector 26.

Referring to FIG. 17, the predetermined region 35a of the insulation layer 35' exposed by the second photoresist pattern 110 is etched using the second photoresist pattern 110 as an etch mask to form an insulation layer pattern 35 that has an opening 33. The etching may include wet etching or dry etching. A width w2 of a predetermined region of one surface of the through via 23 exposed by the insulation layer pattern 35 or the opening 33 may be smaller than the width w1 of the via hole 16 or the width 3 of the conductive connector 26. The insulation layer pattern 35 may cover sidewalls of the elevated portion (27 of FIG. 6) of the through via 23 exposed through the second surface 12 of the semiconductor substrate 10 and a portion of a top surface of the elevated portion 27. That is, a portion of the insulation layer pattern 35 may overlap the predetermined region of the through via 23, e.g., the predetermined region of the conductive connector 26. A sidewall 36 of the insulation layer pattern 35 may be spaced apart from an inner wall 17 of the via hole 16 and may be positioned on the conductive connector 26.

The conductive layer 40 for forming a redistribution layer 45 as shown in FIG. 6 may be formed on the insulation layer pattern 35 in the same manner as shown in FIG. 14, and the insulation layer pattern 35 formed on the initial second surface 12' of the semiconductor substrate 10 may be exposed by a planarizing process. For example, the planarizing process may be a chemical mechanical polishing (CMP) process of removing the redistribution layer forming conductive layer 40. In the planarizing process, the insulation layer pattern 35 formed on the initial second surface 12' of the semiconductor substrate 10 may be used as a planarizing stopper layer.

A fabricating method of a semiconductor device according to still another embodiment of the inventive concept will now be described with reference to FIGS. 18 to 21 together with FIG. 8. FIGS. 18 to 21 are cross-sectional views illustrating a fabricating method of a semiconductor device according to still another embodiment of the inventive concept. For convenience of explanation, a portion 'C' shown in FIG. 8 is exaggerated in FIGS. 18 to 21. Here, substantially the same elements as those of FIG. 8 are denoted by identical reference numerals, and detailed descriptions thereof will be omitted. The following description will focus on processes different from those shown in FIGS. 10 to 14.

Figure 18:
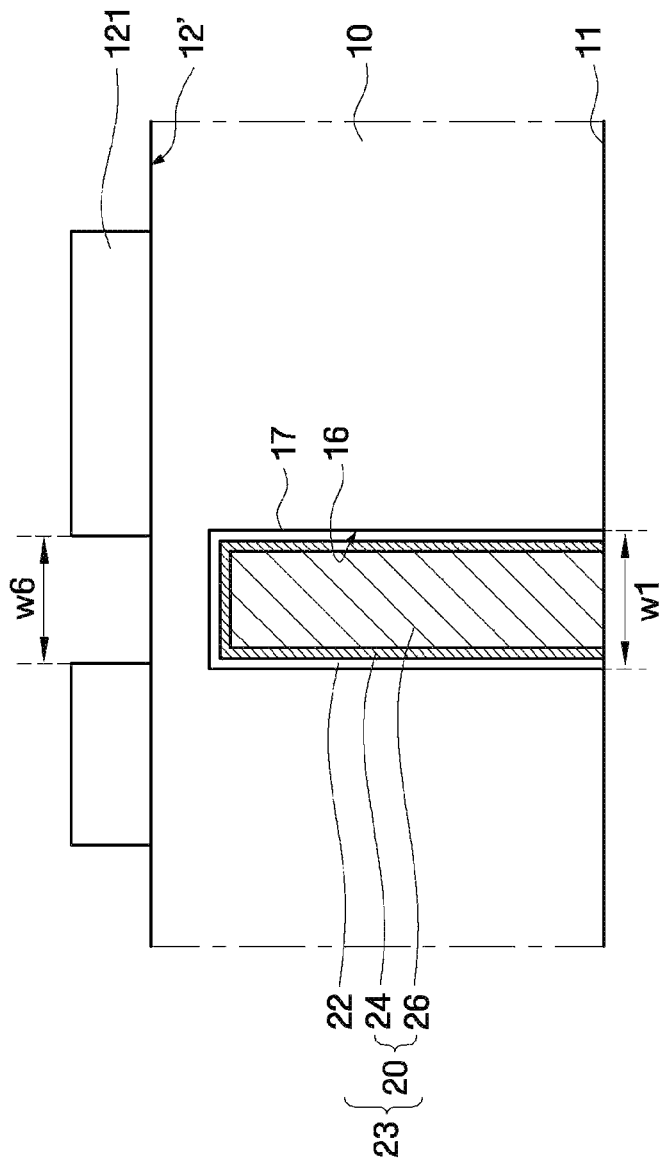
FIGS. 18 to 21 are cross-sectional views illustrating a fabricating method of a semiconductor device according to still another embodiment of the inventive concept.

Referring to FIG. 18, a through via 23 is formed in a semiconductor substrate 10 in the same manner as shown in FIG. 10, a third photoresist pattern 121 is formed on the initial second surface (may also be referred to as a substrate surface) 12' of the semiconductor substrate 10. The third photoresist pattern 121 may be formed where a redistribution layer (47 and 48 of FIG. 7) is not formed. A width w6 of a region of the through via 23 exposed by the third photoresist pattern 121 may be smaller than the width w1 of the via hole 16.

Figure 19:
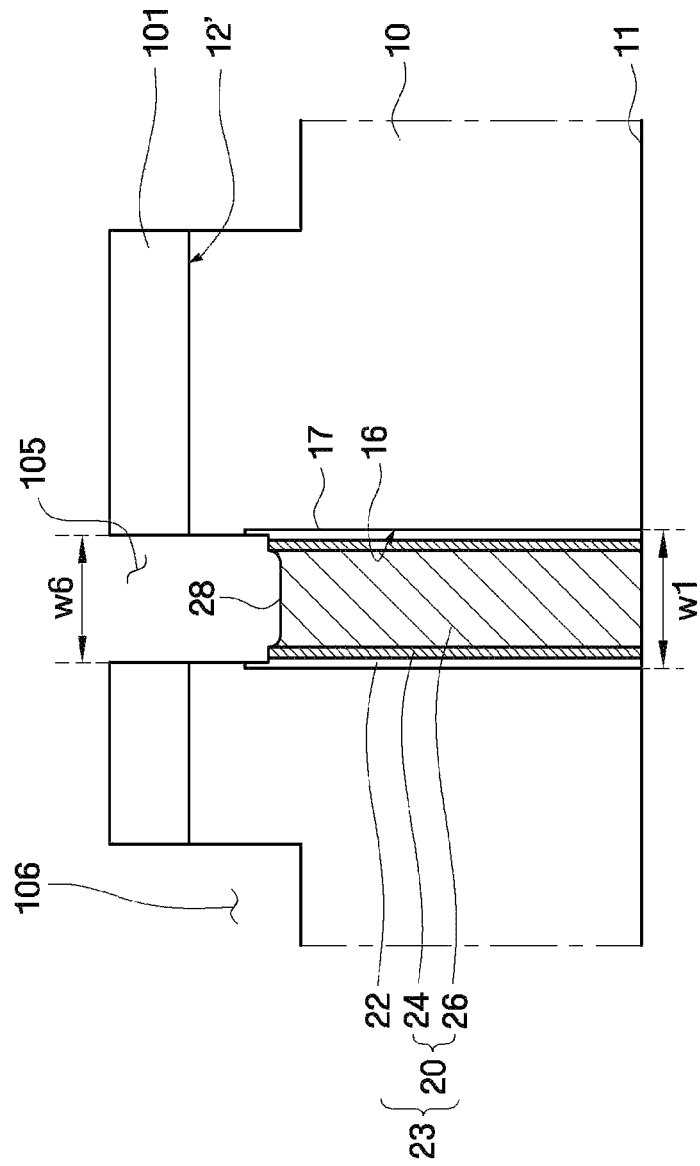

Referring to FIG. 19, trenches 105 and 106 may be formed in the initial second surface 12' of the semiconductor substrate 10 by removing a predetermined region of the semiconductor substrate 10 exposed by the third photoresist pattern 121 using the third photoresist pattern 121 as an etch mask. The etching may be performed on a region where the through via 23 is formed until a top surface 28 of the conductive connector 26 is exposed. The region where the through via 23 is not formed may not be etched to a greater depth than the region where the through via 23 is formed. As a result, a first sub trench 105 formed where the through via 23 is formed and a second sub trench 106 formed where the through via 23 is not formed may have different depths. In an exemplary embodiment, the depth of the second sub trench 106 may be greater than that of the first sub trench 105. On the other hand, a width w6 of the first sub trench 105 may be smaller than the width w1 of the via hole 16. After the etching, the third photoresist pattern 121 may be removed.

Figure 20:
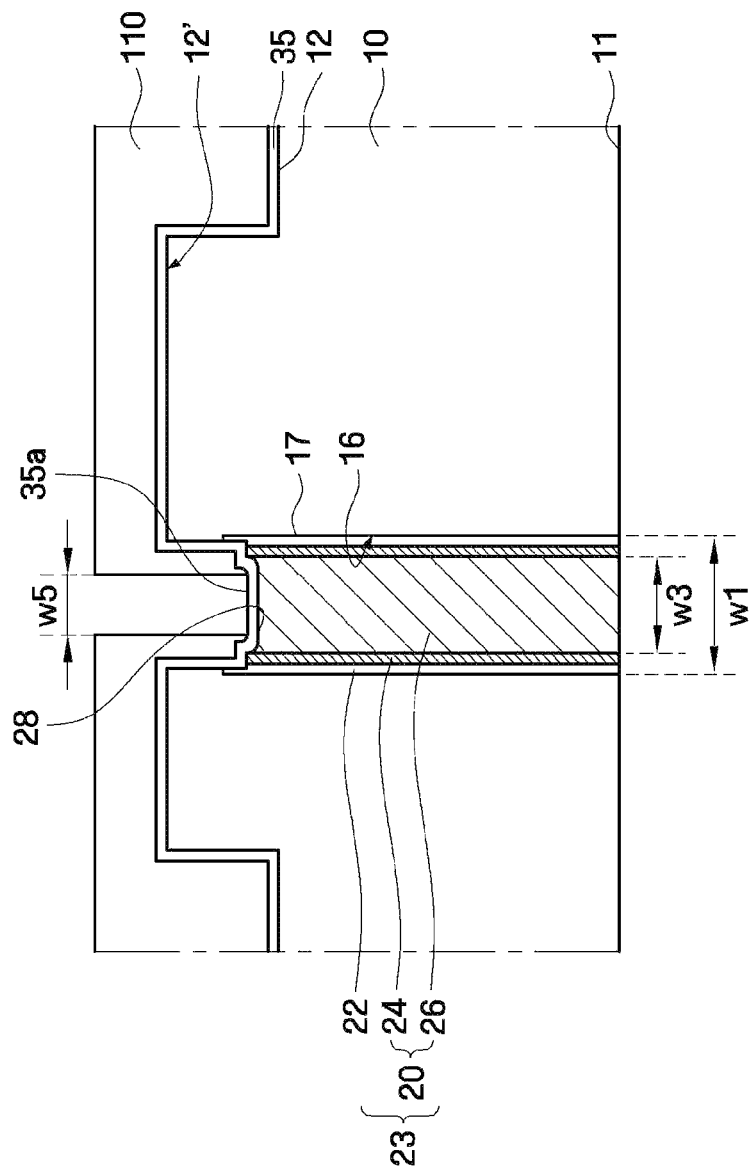

Referring to FIG. 20, an insulation layer 35' may be formed on the second surface 12 of the semiconductor substrate 10 having the trenches 105 and 106. The insulation layer 35' may be formed by physical vapor deposition (PVD) or chemical vapor deposition (CVD). The insulation layer 35' may be conformally formed along the second surface 12 of the semiconductor substrate 10. A second photoresist pattern 110 may be formed on the insulation layer 35'. The second photoresist pattern 110 may be formed at a location where the insulation layer 35' is not to be removed. A predetermined region 35a of the insulation layer 35' exposed by the second photoresist pattern 110 may be removed to form an insulation layer pattern 35. The second photoresist pattern 110 may be formed such that a width w5 of the predetermined region 35a of the insulation layer pattern 35 is smaller than the width w1 of the via hole 16 or the width w3 of the conductive connector 26.

Figure 21:
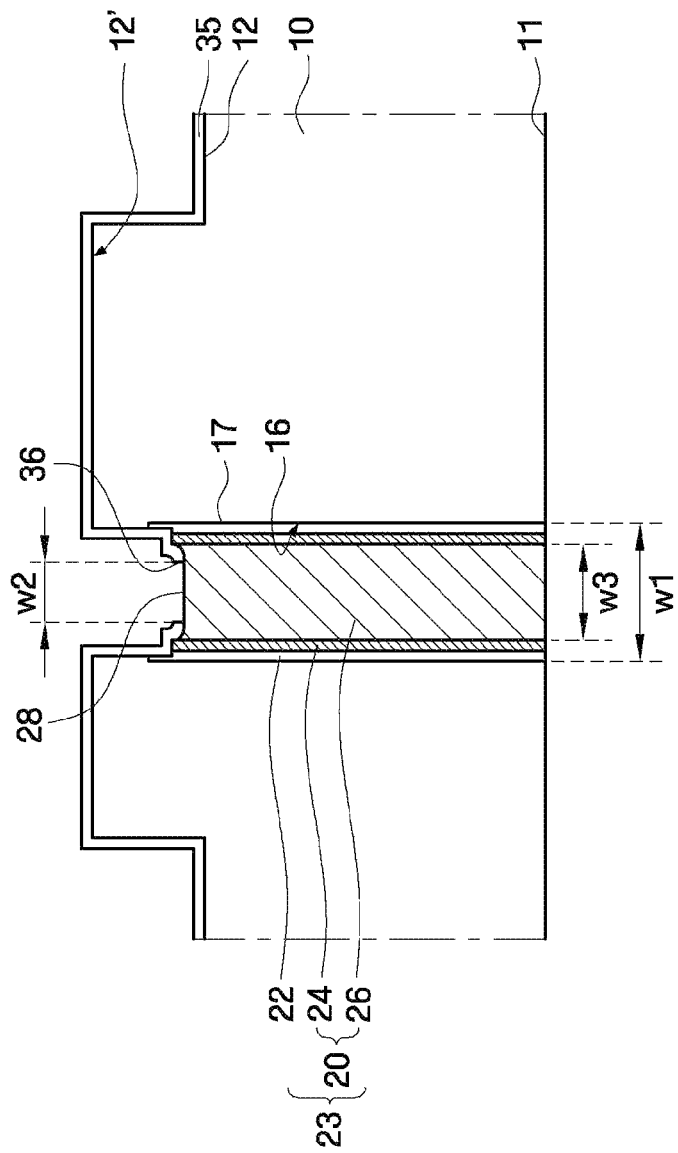

Referring to FIG. 21, the predetermined region 35a (FIG. 20) of the insulation layer 35' exposed by the second photoresist pattern 110 is etched using the second photoresist pattern 110 as an etch mask. The etching may include wet etching or dry etching. A width w2 of a predetermined region of the top surface 28 of the through via 23 exposed by the insulation layer pattern 35 may be smaller than the width w1 of the via hole 16 or the width w3 of the conductive connector 26. Since a portion of the top surface of the via hole insulating layer 22 is not exposed in the etching of the insulation layer 35', it is possible to prevent the via hole insulating layer 22 from being damaged at an interface between the semiconductor substrate 10 and the via hole insulating layer 22 in the etching of the insulation layer 35'.

A portion of the insulation layer pattern 35 may overlap with a predetermined region of the through via 23, e.g., a predetermined region of the conductive connector 26. A sidewall 36 of the insulation layer pattern 35 may be spaced apart from an inner wall 17 of the via hole 16 and may be positioned on the conductive connector 26.

Referring to FIG. 8, the redistribution layer forming conductive layer 40 is formed on the insulation layer pattern 35 in the same manner as shown in FIG. 14, and the insulation layer pattern 35 formed on the initial second surface 12' of the semiconductor substrate 10 may be exposed by a planarizing process. For example, the planarizing process may be a chemical mechanical polishing (CMP) process of removing the redistribution layer forming conductive layer 40. In the planarizing process, the insulation layer pattern 35 formed on the initial second surface 12' of the semiconductor substrate 10 may be used as a planarizing stopper layer.

The embodiments previously described with reference to FIGS. 1 to 9 may also be applied to an interposer 4. In this case, the integrated circuit 13 illustrated in FIGS. 1 to 9 may not be formed.

Figure 22:
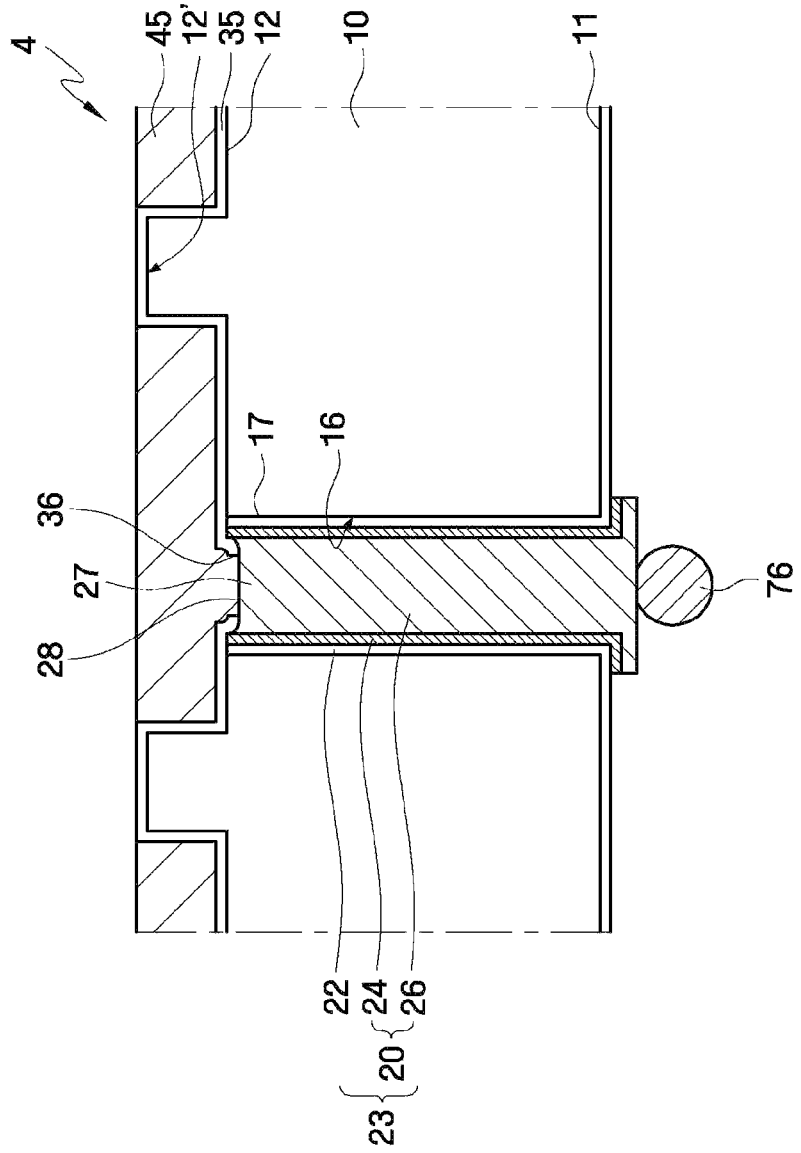
FIG. 22 is a cross-sectional view illustrating an interposer to which the embodiment of the inventive concept shown in FIG. 6 is used.
Figure 23:
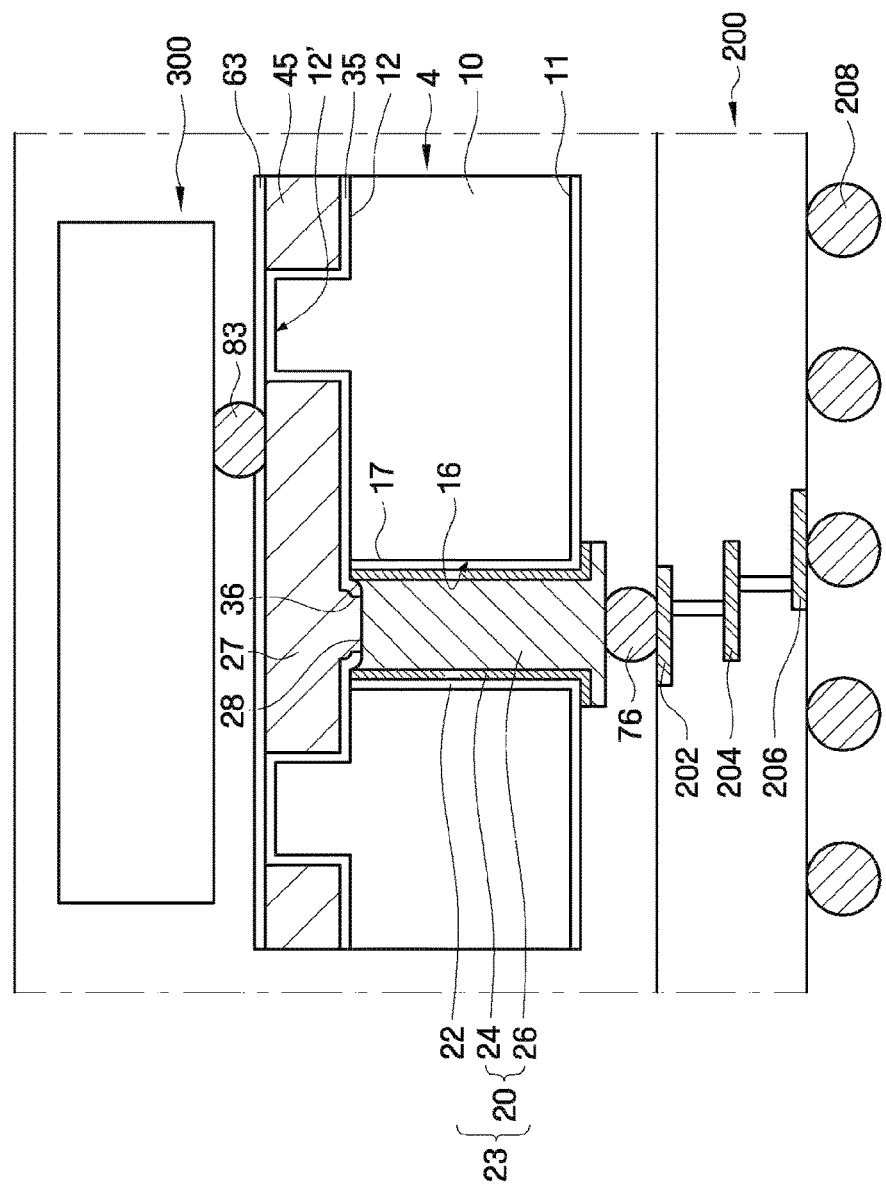
FIG. 23 is a cross-sectional view illustrating a semiconductor package using the interposer shown in FIG. 22.

An interposer according to an embodiment of the inventive concept and a semiconductor package using the interposer will now be described with reference to FIGS. 22 and 23. FIG. 22 is a cross-sectional view illustrating an interposer to which the embodiment of the inventive concept shown in FIG. 6 is used, and FIG. 23 is a cross-sectional view illustrating a semiconductor package using the interposer shown in FIG. 22. While FIGS. 22 and 23 illustrate the interposer using the semiconductor device shown in FIG. 6, other semiconductor devices shown in FIGS. 1 to 9 may also be used.

Referring to FIG. 22, the semiconductor substrate 10 of the interposer 4 may be a silicon or glass substrate. A second connection terminal 76 may be formed on a first surface 11 of the semiconductor substrate 10. The second connection terminal 76 is electrically connected to a through electrode 20. The second connection terminal 76 may be at least one selected from the group consisting of a conductive bump, a solder ball, a conductive spacer, a pin grid array (PGA), and combinations thereof.

Referring to FIG. 23, the interposer 4 shown in FIG. 22 may be mounted on a package substrate 200. The package substrate 200 having a circuit pattern 204 formed thereon may be a flexible printed circuit board, a rigid printed circuit board, or a combination thereof. The circuit pattern 204 may be connected to a bonding pad 202 or ball pad 206 exposed externally.

The interposer 4 may be electrically connected to the bonding pad 202 through the second connection terminal 76 connected to a conductive connector 26. In addition, the interposer 4 may be connected to an external connection terminal 208 through the circuit pattern 204 of the package substrate 200.

Another semiconductor device 300 may be stacked on the interposer 4. The semiconductor device 300 may be electrically connected to a redistribution layer 45 of the interposer 4 through a third connection terminal 83. In an exemplary embodiment, the semiconductor device 300 may be a semiconductor chip, and the third connection terminal 83 may be a flip-chip bump or a conductive bump. If a plurality of the third connection terminal 83 and a plurality of the through electrode 20 are formed, an interval between the third connection terminals 83 may be smaller than an interval between the through electrodes 20. When it is not possible to connect the semiconductor device 300 directly with to the bonding pad 202 of the package substrate 200 due to a small interval between the third connection terminals 83, the interposer 4 including the redistribution layer 45 may be disposed between the semiconductor device 300 and the package substrate 200.

Figure 24:
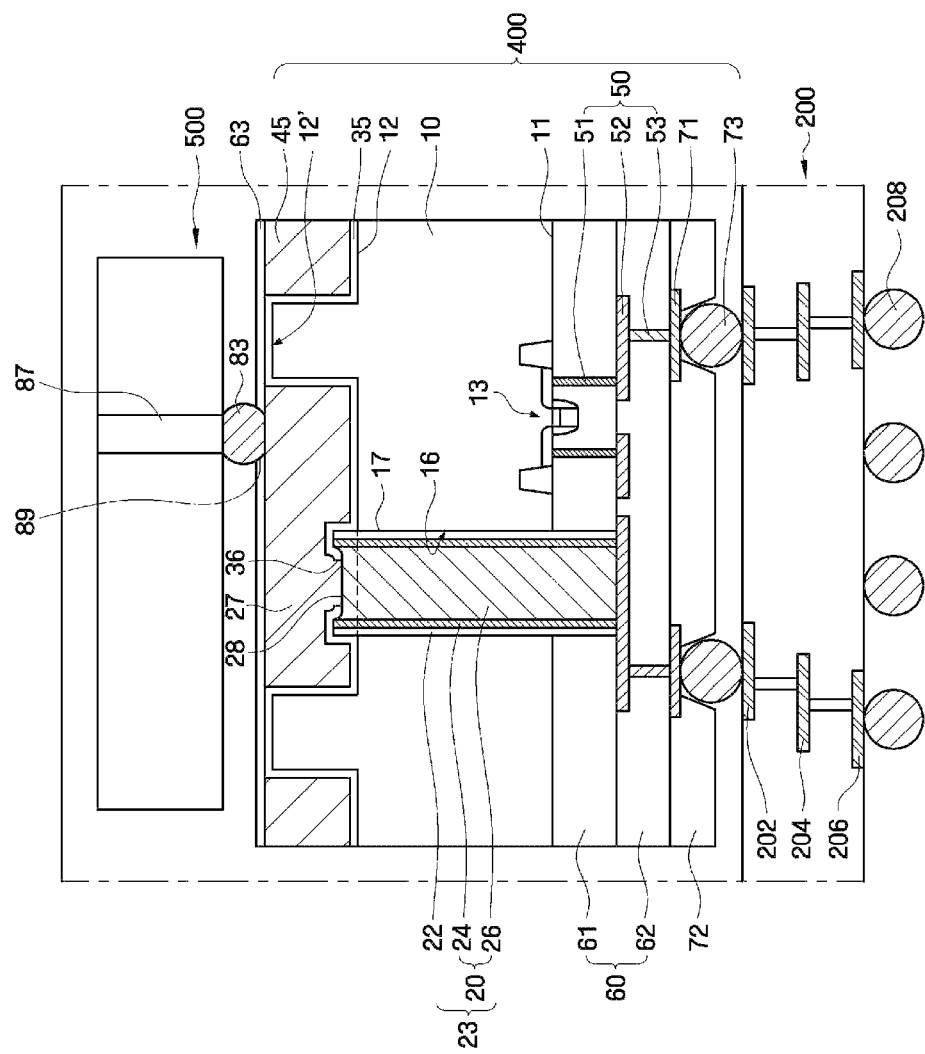
FIG. 24 is a cross-sectional view illustrating a semiconductor package according to another embodiment of the inventive concept

A semiconductor package according to another embodiment of the inventive concept will now be described with reference to FIG. 24. FIG. 24 is a cross-sectional view illustrating a semiconductor package according to another embodiment of the inventive concept.

The embodiments previously described with reference to FIGS. 1 to 9 may be applied to a first semiconductor chip 400 including a first through via 23 of a semiconductor package. FIG. 24 shows that the semiconductor device shown in FIG. 6 is used as the first semiconductor chip 400.

Referring to FIG. 24, a second semiconductor chip 500 may be stacked on the first semiconductor chip 400. The second semiconductor chip 500 may be a semiconductor chip different from the first semiconductor chip 400. In an exemplary embodiment, the first semiconductor chip 400 may include a logic circuit, and the second semiconductor chip 500 may include a memory circuit. The second semiconductor chip 500 may be a high-performance memory chip for assisting the operation of the first semiconductor chip 400.

The first semiconductor chip 400 may be mounted on a package substrate 200 such that its first surface 11 faces the package substrate 200. The first semiconductor chip 400 may include a first connection terminal 73 on its first surface 11. The first connection terminal 73 may be connected to a through electrode 20. In addition, the first connection terminal 73 may be connected to an integrated circuit 13. The integrated circuit 13 may be directly connected to the package substrate 200 through the first connection terminal 73. The integrated circuit 13 may be directly connected to the second semiconductor chip 500 through the through electrode 20 and the redistribution layer 45.

The second semiconductor chip 500 may be connected to the first semiconductor chip 400 through a third connection terminal 83 formed on one surface thereof. The third connection terminal 83 and the through electrode 20 may be connected to each other through the redistribution layer 45. The second semiconductor chip 500 may be electrically connected to the package substrate 200 through the third connection terminal 83, the redistribution layer 45, the through electrode 20 and the first connection terminal 73.

In one embodiment, the second semiconductor device 500 may include a second through via 87, which does not overlap with a first through via 23 in plan view or in cross-sectional view.

In another embodiment, one or more additional semiconductor devices (not illustrated) can be stacked over the second semiconductor device 500 and can be electrically coupled to the second through via 87 and one or more redistribution layers.

Figure 25:
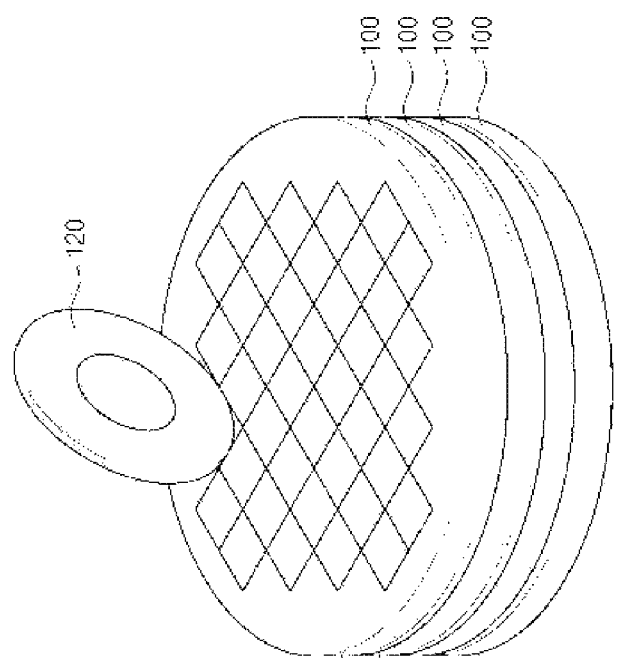
FIGS. 25 and 26 illustrate a fabricating method of a semiconductor package, according to an embodiment of the inventive concept.
Figure 26:
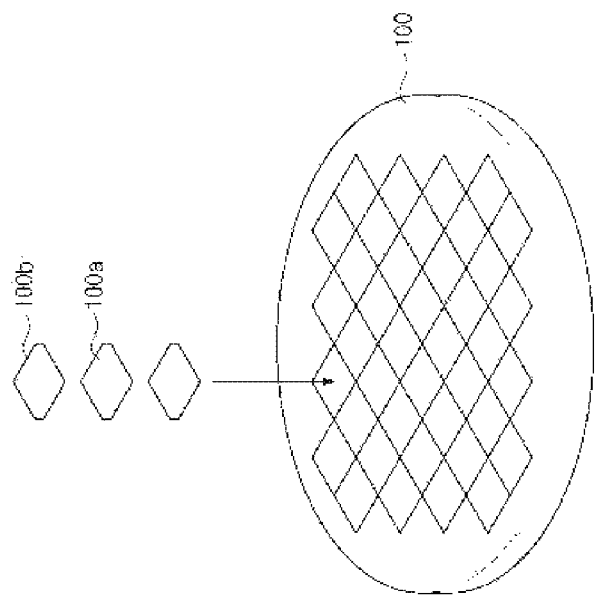

FIGS. 25 and 26 illustrate a fabricating method of a semiconductor package, according to an embodiment of the inventive concept.

Referring to FIG. 25, a plurality of semiconductor wafers 100 having semiconductor devices obtained by the fabricating methods shown in FIGS. 1 to 22 may be provided. The plurality of semiconductor wafers 100 may be stacked one on another. The stacked plurality of semiconductor wafers 100 are cut along scribe line portions of the semiconductor devices, thereby separating the semiconductor wafers 100 into individual semiconductor packages. The cutting may be performed using a cutter 120 or laser.

Alternatively, as shown in FIG. 26, individual semiconductor devices 100a, 100b, are stacked on the semiconductor wafer 100 to form semiconductor packages. Alternatively, the semiconductor wafer 100 may be cut along scribing lane portions to be separated into individual semiconductor devices 100a, 100b, . . . , which are then stacked one on another, to form semiconductor packages.

Figure 27:
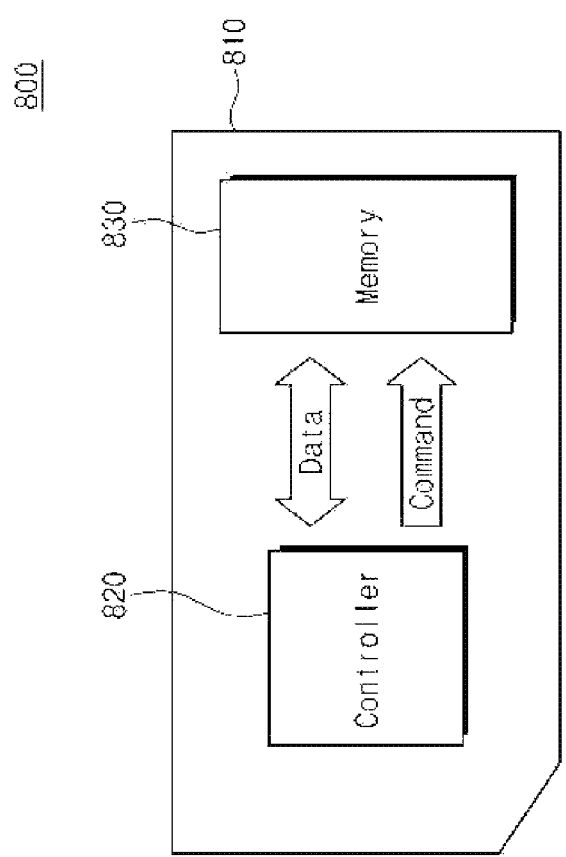
FIG. 27 is a schematic view of a memory card in which the semiconductor device according to some embodiments of the inventive concept are used.

FIG. 27 is a schematic view of a memory card 800 in which the semiconductor device.

Referring to FIG. 27, the memory card 800 may include a controller 820 and a memory 830 in a housing 810. The controller 820 and the memory 830 may exchange electrical signals. For example, the memory 830 and the controller 820 may exchange data in response to the command of the controller 820. Accordingly, the memory card 800 may store data in the memory 830 or may output the data stored in the memory 830 to the outside.

The controller 820 or the memory 830 may include at least one of a semiconductor device or a semiconductor package according to some embodiments of the inventive concept. In an exemplary embodiment, the controller 820 may include a system in package, and the memory 830 may include a multi-chip package. Alternatively the controller 820 and/or the memory 830 may be provided as a stacked package. The memory card 800 may be used as data storage media for a variety of portable devices. For example, the memory card 800 may be a multimedia card (MMC), or a secure digital card (SD).

Figure 28:
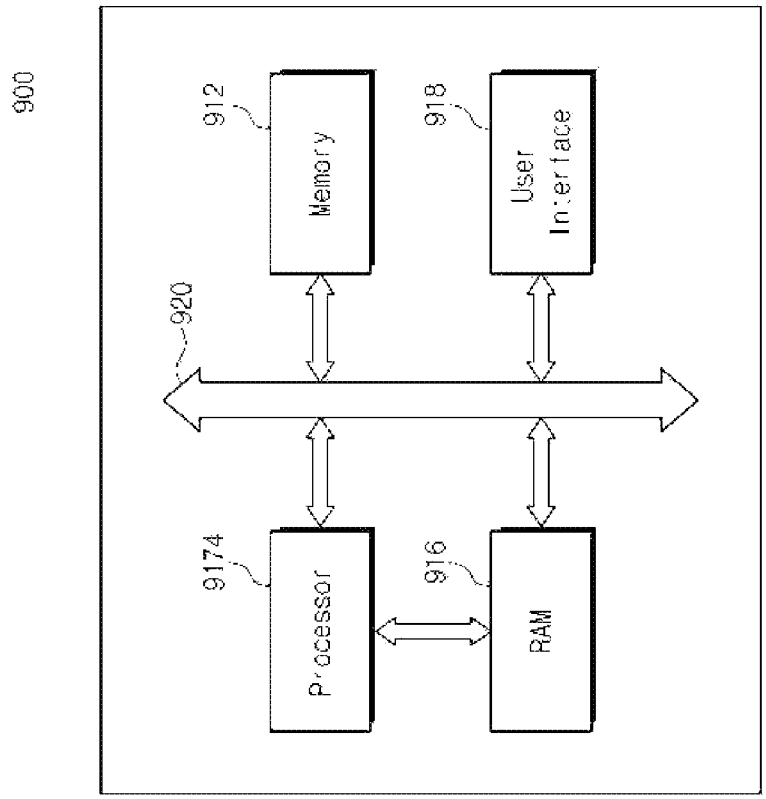
FIG. 28 is a schematic view of an electronic system in which the semiconductor device according to an embodiment of the inventive concept is used.

FIG. 28 is a schematic view of an electronic system 900 in which the semiconductor device according to an embodiment of the inventive concept is used. Referring to FIG. 28, the electronic system 900 may include a semiconductor device or a semiconductor package according to example embodiments. The electronic system 900 may include a mobile device or a computer. For example, the electronic system 900 may include a memory system 912, a processor 914, RAM 916, and a user interface 918, which may execute data communication using a bus 920. The processor 914 may execute the program and control the electronic system 900. The RAM 916 may be used as an operation memory of the processor 914. For example, the processor 914 or the RAM 916 may include a semiconductor device or a semiconductor package according to example embodiments. Alternatively, the processor 914 and the RAM 916 may be packaged in a single package body. The user interface 918 may be used in inputting/outputting data to/from the electronic system 900. The memory system 912 may store codes for operating the processor 914, data processed by the processor 914, or externally input data. The memory system 912 may include a controller and a memory, and has substantially the same configuration as that of the memory card 800 shown in FIG. 25.

Figure 29:
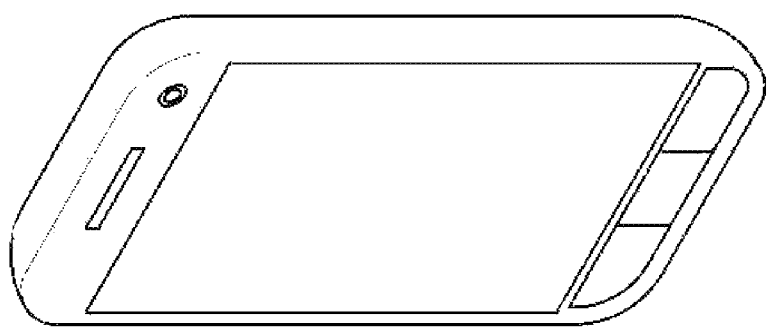
FIG. 29 is a schematic view of a mobile phone in which the electronic system according to an embodiment of the inventive concept is used.

The electronic system 900 may be used in electronic controllers for a variety of electronic devices. FIG. 29 is a schematic view of a mobile phone 1000 in which the electronic system (900 of FIG. 28) according to an embodiment of the inventive concept is used. Additionally, the electronic system (900 of FIG. 28) may be used for a portable notebook computer, an mpeg-1 audio layer 3 (MP3) player, a navigator, a solid state disk (SSD), automobiles or household appliances.

The present disclosure provides a semiconductor device which has a redistribution pattern buried in a semiconductor substrate and can prevent characteristics of the semiconductor device from deteriorating, and can further prevent the semiconductor substrate and a through silicon via from being shorted.

Throughout the specification, features shown in one embodiment may be incorporated in other embodiments within the spirit and scope of the inventive concept.

Embodiments of the present application may also be applied to form ASICs, PLDs/Gate Arrays, DSPs, Graphics and PC chipsets. Also, embodiments of the present application can be used to form a storage device for notebook PCs and sub-notebooks for enterprises, Ultra-Mobile PCs (UMPC), and Tablet PCs.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Various operations will be described as multiple discrete steps performed in a manner that is most helpful in understanding the invention. However, the order in which the steps are described does not imply that the operations are order-dependent or that the order that steps are performed must be the order in which the steps are presented.

While the present disclosure has been particularly shown and described with reference to exemplary embodiments thereof, it will be understood by those of ordinary skill in the art that various changes in form and details may be made therein without departing from the spirit and scope of the present disclosure as defined by the following claims. It is therefore desired that the present embodiments be considered in all respects as illustrative and not restrictive, reference being made to the appended claims rather than the foregoing description to indicate the scope of the invention.

What is claimed is:
1. A semiconductor device comprising:
   a semiconductor substrate having a first surface and a second surface opposite to the first surface, the second surface defining a redistribution trench, the substrate having a via hole extending therethrough;

a through via disposed in the via hole, the through via including a via hole insulating layer, a barrier layer and a conductive connector sequentially formed therein;

an insulation layer pattern formed on the second surface of the semiconductor substrate, the insulation layer pattern defining an opening that partially exposes a top surface of the conductive connector; and a redistribution layer disposed in the redistribution trench and electrically connected to the through via, wherein the insulation layer pattern covers an interface region between the second surface of the substrate and a top surface of the via hole insulating layer, wherein the top surface of the via hole insulating layer is substantially coplanar with a top surface of the conductive connector, and wherein a top surface of the conductive connector is lower than a top surface of the insulation layer pattern.

2. The device of claim 1, wherein the top surface of the via hole insulating layer is substantially coplanar with a bottommost portion of the second surface.

3. The device of claim 1, wherein a sidewall of the insulation layer pattern is positioned on the top surface of the via hole insulating layer.

4. A semiconductor package comprising:
a package substrate; and a first semiconductor device provided on the package substrate, wherein the first semiconductor device comprises:
a semiconductor substrate having a first surface, and a second surface opposite to the first surface, the second surface defining a redistribution trench, the semiconductor substrate having a via hole extending therethrough;
a first through via disposed in the via hole, the first through via including a via hole insulating layer, a barrier layer, and a conductive connector sequentially formed therein;
an insulation layer pattern formed on the second surface of the substrate, the insulating layer pattern defining an opening that partially exposes a region of a top surface of the conductive connector; and
a redistribution layer disposed in the redistribution trench and electrically connected to the first through via, wherein the insulation layer pattern covers an interface region between the second surface of the substrate and a top surface of the via hole insulating layer,
wherein a width of the redistribution trench is wider than a width of the via hole in cross-section, and
wherein a top surface of the conductive connector is lower than a top surface of the insulation layer pattern.

5. The semiconductor package of claim 4, wherein the package substrate further comprises a circuit pattern, and the first through via is electrically connected to the circuit pattern.

6. The semiconductor package of claim 4, further comprising a second semiconductor device overlying the redistribution layer of the first semiconductor device.

7. The semiconductor package of claim 6, wherein the second semiconductor device includes a second through via, and wherein the second through via does not overlap with the first through via.

8. The semiconductor package of claim 7, wherein the second semiconductor device includes a connection terminal coupled to the second through via, and wherein the connection terminal is coupled to the redistribution layer.

9. The semiconductor package of claim 8, further comprising a protective layer overlying the redistribution layer having an opening part exposing a region of the redistribution layer such that the connection terminal can be mounted there on.

10. The semiconductor device of claim 4, wherein at least a portion of the insulation layer pattern is formed on a bottom surface of the redistribution trench and below the redistribution layer.

11. A semiconductor device comprising:
a semiconductor substrate having a first surface and a second surface opposite to the first surface, the second surface defining a redistribution trench, the substrate having a via hole extending therethrough;
a through via disposed in the via hole, the through via including a via hole insulating layer, a barrier layer and a conductive connector sequentially formed therein;
an insulation layer pattern formed on the second surface of the substrate, the insulation layer pattern defining an opening that partially exposes a top surface of the conductive connector; and
a redistribution layer disposed in the redistribution trench and electrically connected to the through via, wherein the insulation layer pattern covers an interface region between the second surface of the substrate and a top surface of the via hole insulating layer,
wherein a width of the redistribution trench wider than a width of the via hole in cross-section,
wherein the top surface of the via hole insulating layer is substantially coplanar with a top surface of the conductive connector, and
wherein a top surface of the conductive connector is lower than a top surface of the insulation layer pattern and a top surface of the conductive connector is recessed.

12. The device of claim 11, wherein substantially all of the redistribution trench is disposed above the top surface of the via hole insulating layer in cross-section.

13. The device of claim 11, wherein the insulation layer pattern extends in a horizontal direction with substantially no extension into the via hole in a vertical direction in cross-section.

14. The device of claim 11, wherein the insulation layer pattern comprises a single layer.

15. The device of claim 11, wherein no portion of the insulation layer pattern extends into the via hole in cross-section.

16. The device of claim 11, wherein at least a portion of the insulation layer pattern is formed on a bottom surface of the redistribution trench and below the redistribution layer.

* * * * *